US012745395B2

(12) United States Patent
Nishikawa

(10) Patent No.: US 12,745,395 B2
(45) Date of Patent: Sep. 22, 2026

(54) SEMICONDUCTOR MEMORY DEVICE

(71) Applicant: Kioxia Corporation, Tokyo (JP)

(72) Inventor: Takuya Nishikawa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 795 days.

(21) Appl. No.: 18/159,634

(22) Filed: Jan. 25, 2023

(65) Prior Publication Data

US 2024/0064980 A1 Feb. 22, 2024

(30) Foreign Application Priority Data

Aug. 18, 2022 (JP) ................................ 2022-130819

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ........ H10B 43/27; H10B 41/27; H10B 43/50; H10B 43/10
See application file for complete search history.

(56) References Cited

U.S. PATENT DOCUMENTS 9,646,975 B2 5/2017 Peri
12,096,636 B2 * 9/2024 Rajashekhar .......... H10B 43/35
2012/0228697 A1 * 9/2012 Youm .................... H10B 41/27 257/329
2020/0295020 A1 9/2020 Mori

FOREIGN PATENT DOCUMENTS

JP 2020150218 A 9/2020

* cited by examiner

*Primary Examiner* — Fernando L Toledo
*Assistant Examiner* — Jorge Andres Lopez
(74) *Attorney, Agent, or Firm* — Kim & Stewart LLP

(57) ABSTRACT

A semiconductor memory device includes stacked conductive layers, a first insulating layer above the conductive layers in a stacking direction, and a second insulating layer above the first insulating layer and the conductive layers. A first semiconductor pillar extends in the stacking direction through the conductive layers and the first insulating layer. A first charge storage film is between the conductive layers and the first semiconductor pillar. A via contact electrode extends in the stacking direction through the second insulating layer and is connected to a first end of the first semiconductor pillar. The first insulating layer comprises a material different from that of the second insulating layer.

20 Claims, 33 Drawing Sheets

104 103 102 110 101 125 120 130 121 122 STA Z Y X 104
103
102
110
101
125
120
130
121
122
142
141A
Z
Y
X

104 103 102 110 101 SHEA ST 141 142 122 121 125 120 130 Z Y X

FIG. 23

106
105
104
103
102
110
101
SHE
ST
141
142
122
121
125
120
130
Z
Y
X 106
105
104
103
102
110
101
SHE
ChA
125
120
130
122
121
ST
141
142
Z
Y
X

FIG. 26

106
105
104
102
110(SGD)
110(SGD)
110(SGD)
110(SGD)
110(WL)
110(WL)
110(WL)
101
SHE
107 Ch'
122'
121
125
120
130
ST
141
142
Z
Y
X

FIG. 27

106
104
103
102
110(SGD)
110(SGD)
110(SGD)
110(SGD)
110(WL)
110(WL)
110(WL)
101
SHE
107 Ch
122
121
125
120
130
ST
141
142
Z
X
Y

FIG. 28

106
105
104
303
102
110(SGD)
110(SGD)
110(SGD)
110(SGD)
110(WL)
110(WL)
110(WL)
101
SHE
107 Ch
122
121
125
120
130
ST
141
142
Z
X
Y 106
105
104
103
102
110(SGD)
110(SGD)
110(SGD)
110(SGD)
110(WL)
110(WL)
110(WL)
101
SHE
107 Ch4
422
125
120
130
121
ST
141
142
Z
X
Y

FIG. 33

SEMICONDUCTOR MEMORY DEVICE

CROSS-REFERENCE TO RELATED APPLICATION(S)

This application is based upon and claims the benefit of priority from Japanese Patent Application No. 2022-130819, filed Aug. 18, 2022, the entire contents of which are incorporated herein by reference.

FIELD

Embodiments described herein relate generally to a semiconductor memory device.

BACKGROUND

Semiconductor memory devices which include a plurality of stacked conductive layers, a semiconductor pillar extending through the stacked conductive layers with a charge storage film provided between the conductive layers and the semiconductor pillar are known.

BRIEF DESCRIPTION OF THE DRAWINGS

FIGS. 7 to 25 are schematic cross-sectional views illustrating aspects of a method for manufacturing a semiconductor memory device according to a first embodiment.

FIG. 26 is a schematic cross-sectional view of a semiconductor memory device of a comparative example.

FIG. 27 is a schematic cross-sectional view of a portion of a semiconductor memory device according to a second embodiment.

FIG. 28 is a schematic cross-sectional view of a portion of a semiconductor memory device according to a third embodiment.

FIG. 33 is a schematic cross-sectional view of a portion of a semiconductor memory device according to a sixth embodiment.

DETAILED DESCRIPTION

Figure 1:
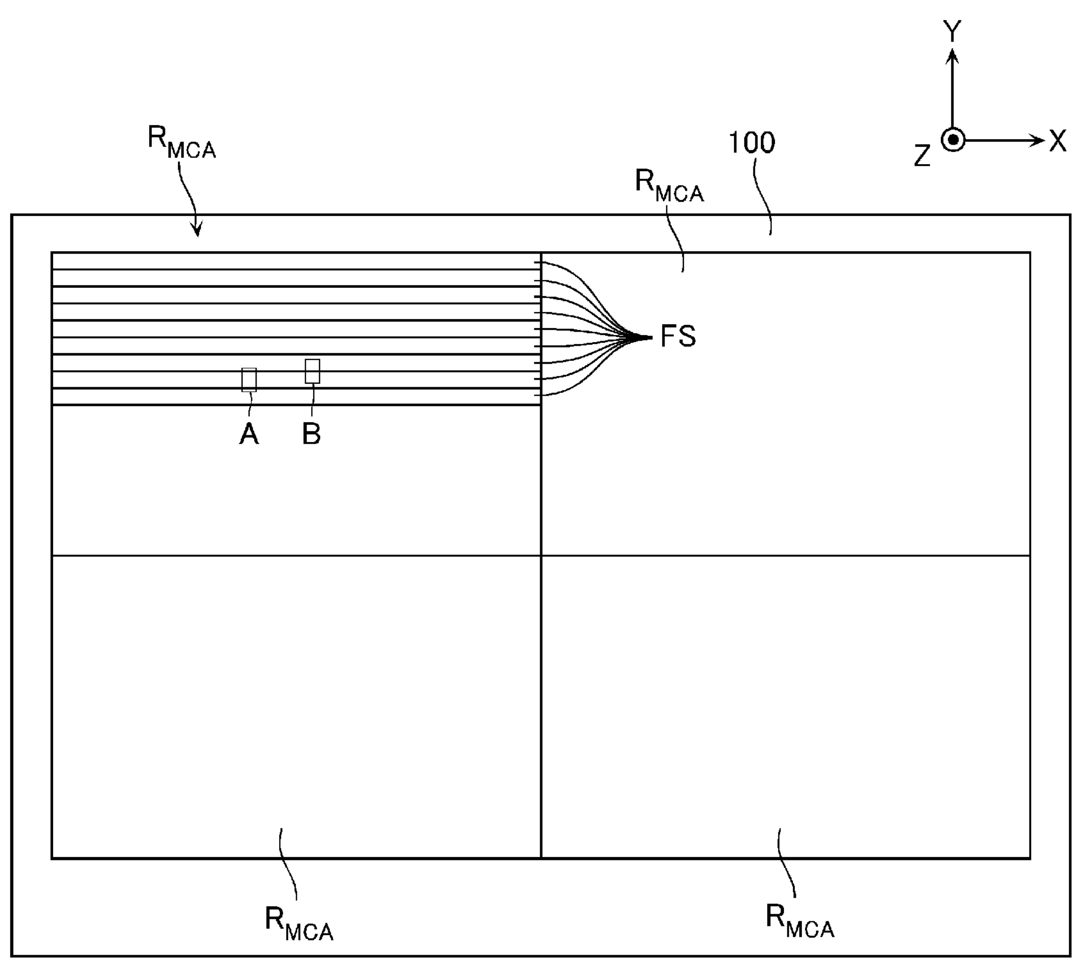
FIG. 1 is a schematic plan view of a semiconductor memory device according to a first embodiment.

In general, according to one embodiment, a semiconductor memory device includes a plurality of conductive layers stacked in a first direction, a first insulating layer on a first side of the plurality of conductive layers, and a second insulating layer on the first insulating layer. The first insulating layer is between the second insulating layer and the plurality of conductive layers in the first direction. A first semiconductor pillar extends in the first direction through the plurality of conductive layers and the first insulating layer. A first end of the first semiconductor pillar extends in the first direction to a position beyond the first insulating layer and the plurality of conductive layers. A first charge storage film is between the first semiconductor pillar and the plurality of conductive layers. A via contact electrode extends in the first direction through the second insulating layer and contacts the first end of the first semiconductor pillar. The first insulating layer comprises a material different from that of the second insulating layer.

Semiconductor memory devices according to certain example embodiments of the present disclosure will now be described with reference to the drawings. The described example embodiments are merely by way of example and are not intended to limit the scope of the present disclosure. The drawings are schematic, and some components or elements may be omitted for the purposes of illustration. The same symbols are used for components or elements common to different embodiments, and explanation thereof may sometimes be omitted from the description of subsequently explained embodiments.

As used herein, the term "semiconductor memory device" may refer to a memory die, a memory system including a controller die, such as a memory chip, a memory card, or an SSD (Solid-State Drive), and/or a host computer, such as a smartphone, a tablet computer, or a personal computer incorporating a memory die and/or a memory system.

As used herein, the expression "a first component is electrically connected to a second component" encompasses a case where the first component is connected directly to the second component and a case where the first component is connected to the second component via an interconnecting component, a semiconductor member, a transistor, or the like. For example, when three transistors are connected in series, the first transistor can be said to be "electrically connected" to the third transistor even when the second transistor is in an off state.

As used herein, "X direction" refers to one direction parallel to the surface of a substrate, "Y direction" refers to another direction parallel to the surface of the substrate but perpendicular to the X direction, and "Z direction" refers to a direction orthogonal to the surface of the substrate.

A direction intersecting the surface of a substrate may be herein referred to as a stacking direction. The stacking direction may or may not coincide with the Z direction.

As used herein, terms such as "above", "upper", "below", and "lower" refer to positions or directions relative to a substrate. For example, a direction along the Z direction going away from the substrate is referred to as "upward", while a direction along the Z direction going toward the substrate is referred to as "downward". The lower surface or end of a structure refers to the substrate-side surface or end of the structure, while the upper surface or end refers to the opposite surface or end of the structure. A surface intersecting the X direction or the Y direction is referred to as a side surface or the like.

First Embodiment

Figure 2:
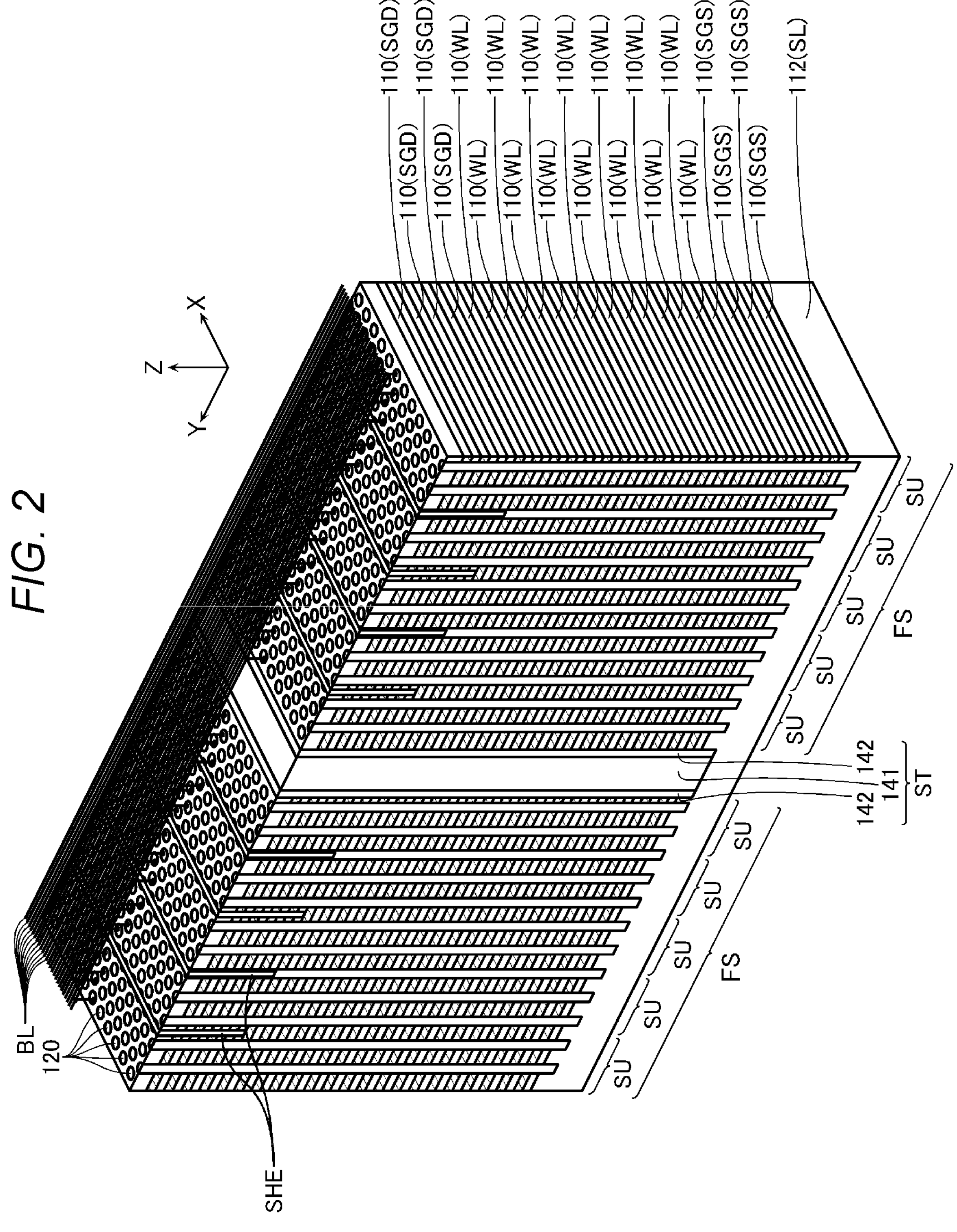
FIG. 2 is a schematic perspective view of a portion of a semiconductor memory device according to a first embodiment.
Figure 3:
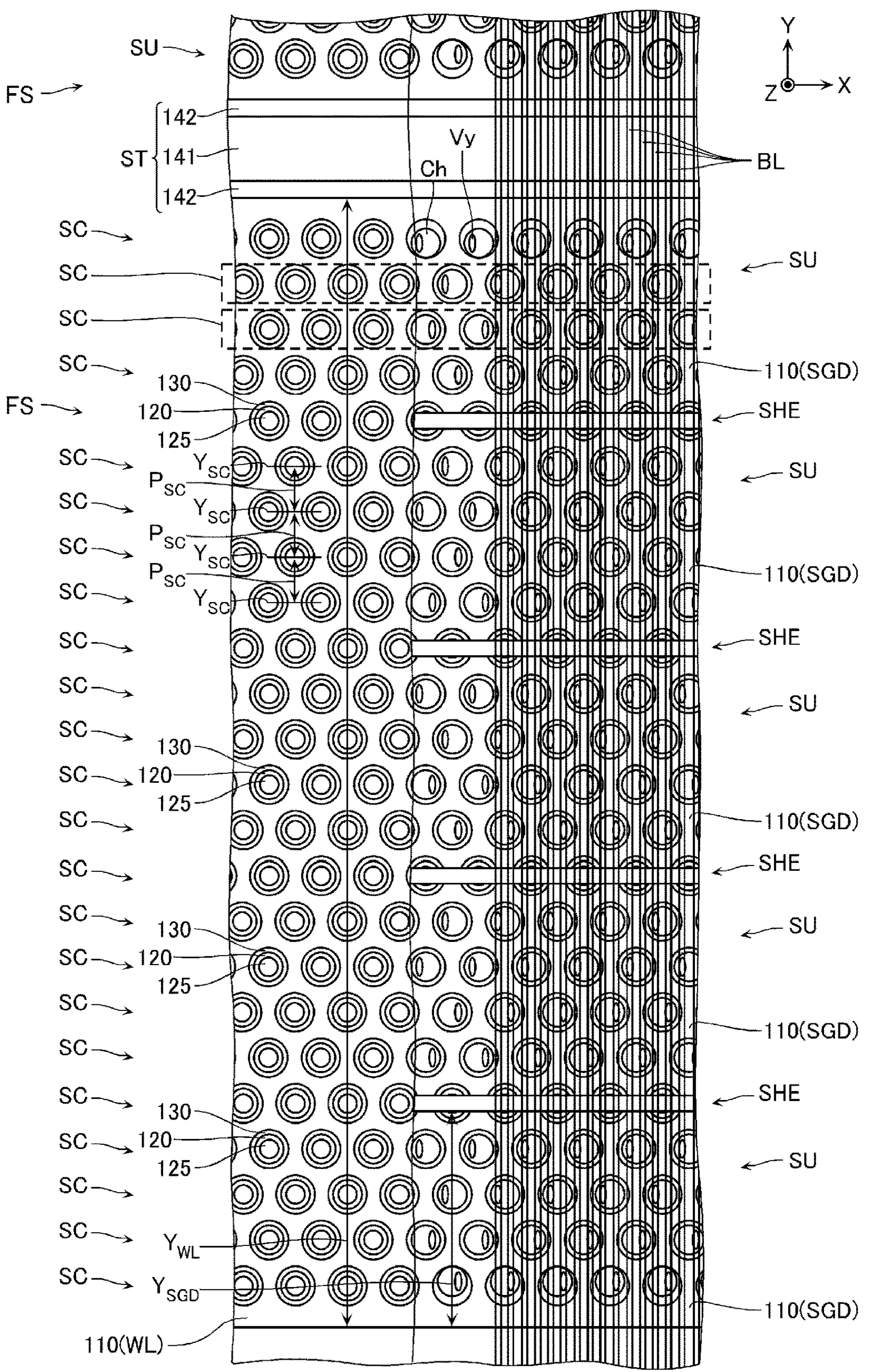
FIG. 3 is a schematic plan view of a portion of a semiconductor memory device according to a first embodiment.
Figure 4:
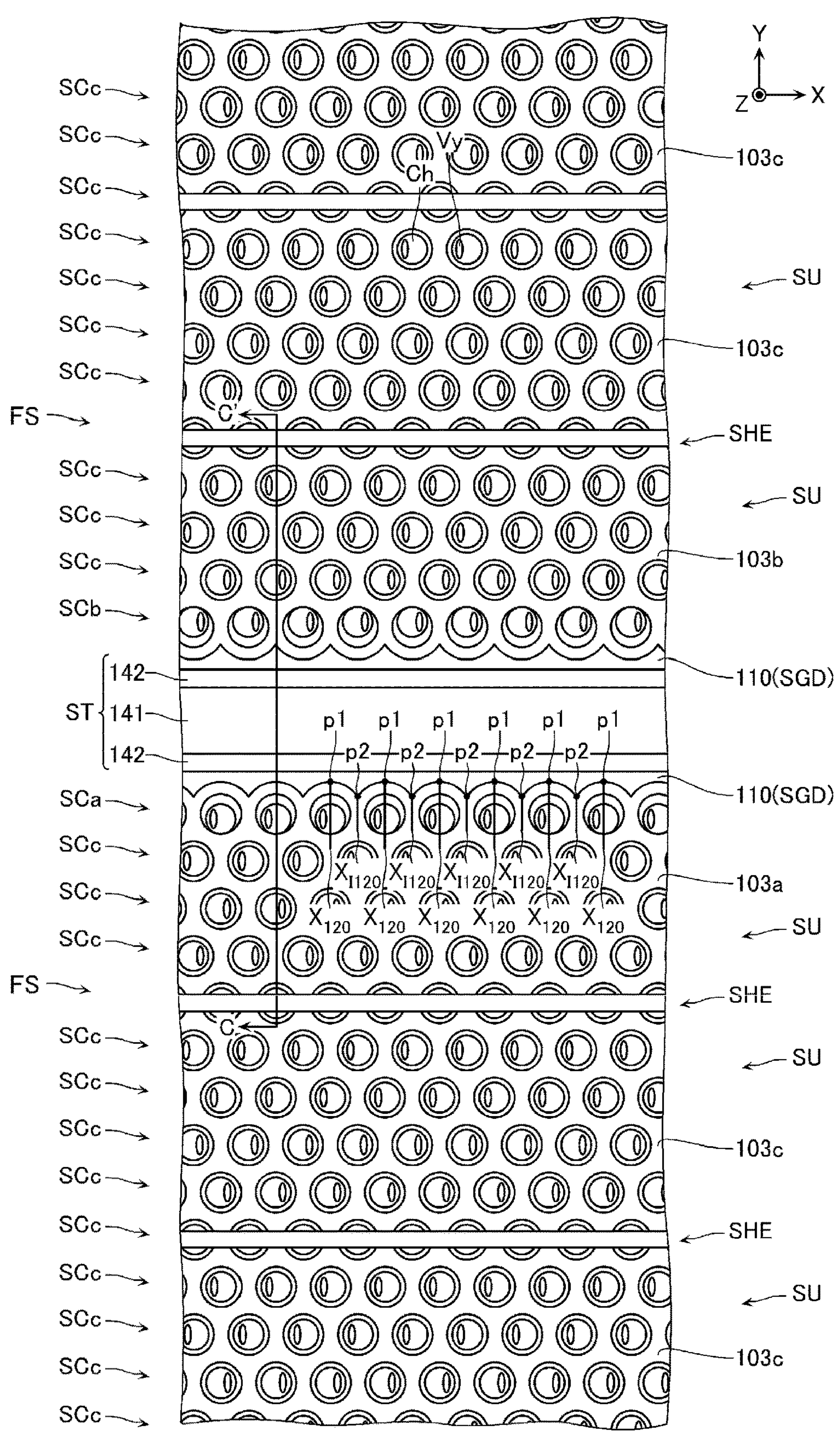
FIG. 4 is a schematic plan view of a portion of a semiconductor memory device according to a first embodiment.
Figure 5:
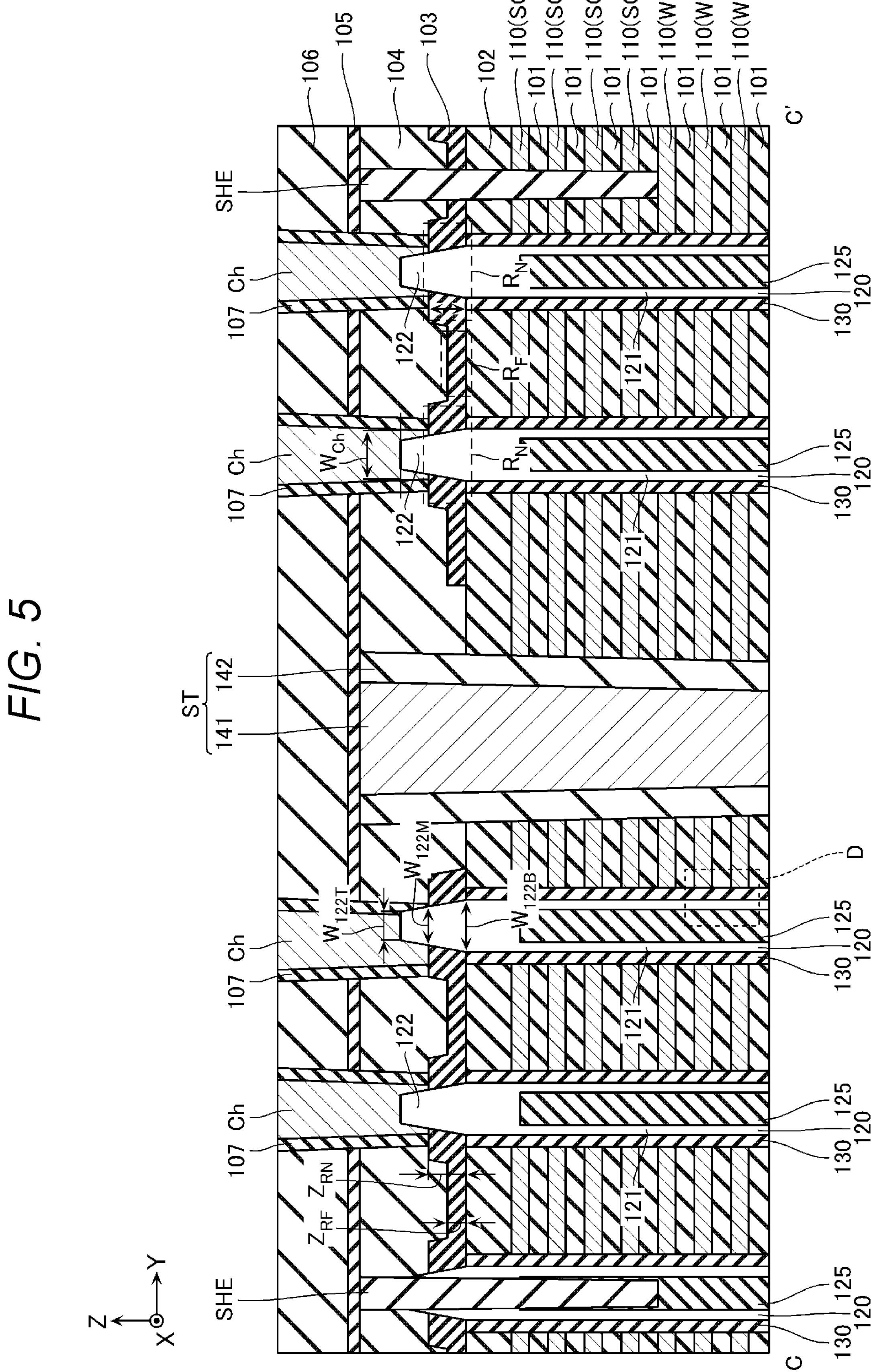
FIG. 5 is a schematic cross-sectional view of a portion of a semiconductor memory device according to a first embodiment.
Figure 6:
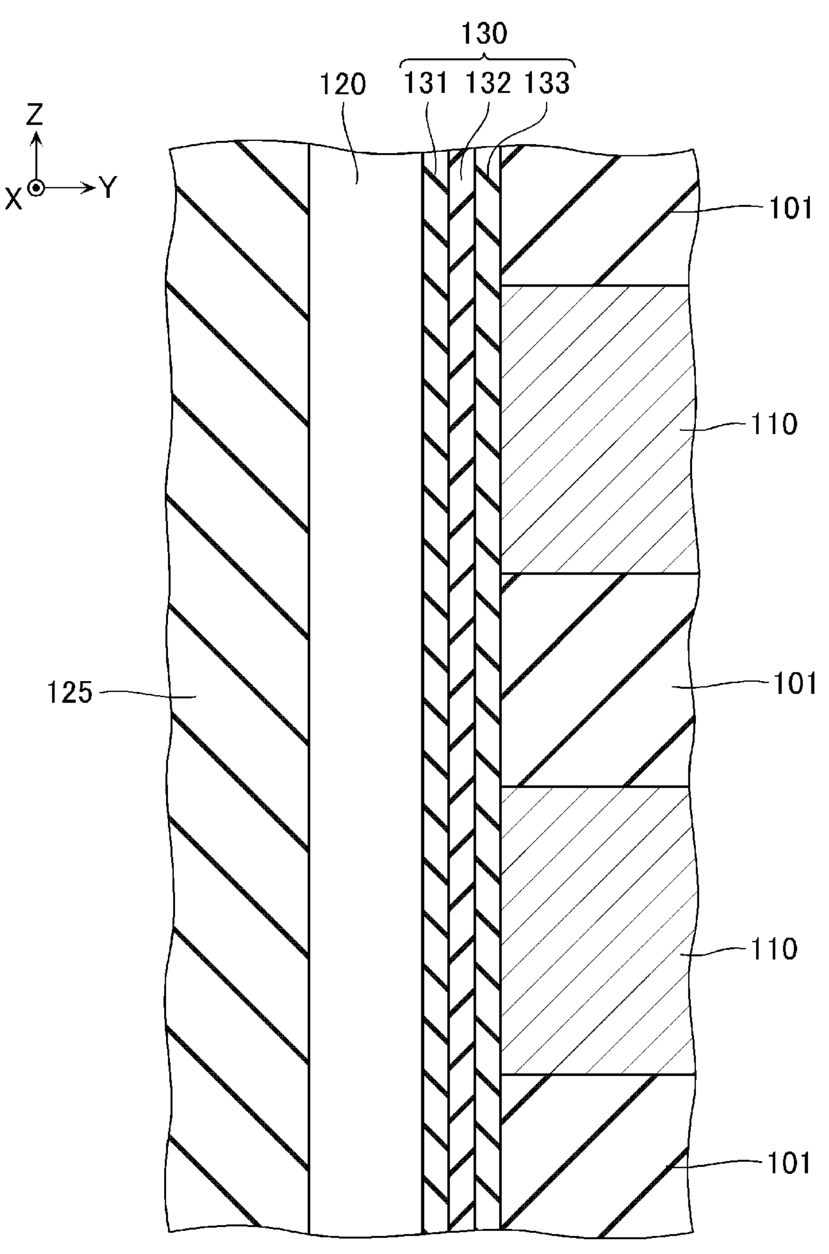
FIG. 6 is a schematic cross-sectional view of a portion of a semiconductor memory device according to a first embodiment.

FIG. 1 is a schematic plan view showing a semiconductor memory device according to a first embodiment. FIG. 2 is a schematic perspective view showing a portion of the semiconductor memory device. FIG. 3 is a schematic plan view of a portion of the semiconductor memory device illustrating an enlarged view of the portion A of FIG. 1. FIG. 4 is a schematic plan view of a portion of the semiconductor memory device illustrating an enlarged view of the portion B of FIG. 1. FIG. 5 is a schematic cross-sectional view of a portion of the semiconductor memory device illustrating the structure shown in FIG. 4 as cut along the line C-C' and viewed in the direction of the arrows. FIG. 6 is a schematic cross-sectional view of a portion of the semiconductor memory device illustrating an enlarged view of the portion D of FIG. 5. While FIG. 6 illustrates a YZ cross-section, the same structure as that of FIG. 6 would be shown in other cross-sections (for example, an XZ cross-section) along the axis of a semiconductor pillar 120.

As shown in FIG. 1, the semiconductor memory device of this first embodiment includes a semiconductor substrate 100. In the illustrated example, the semiconductor substrate 100 has four memory cell array regions RMCA arranged in the X and Y directions.

Each memory cell array region RMCA includes a plurality of finger structures FS arranged in the Y direction. As shown in FIG. 2, each finger structure FS includes 5 string units SU arranged in the Y direction. An inter-finger structure ST is provided between two finger structures FS adjacent to each other in the Y direction. An inter-string unit insulating member SHE of silicon oxide (SiO2) or the like is provided between two string units SU adjacent to each other in the Y direction.

In this first embodiment, each finger structure FS functions as one block of a NAND flash memory; however, it is possible to adopt a design such that a plurality of finger structures FS function as one block. Further, each finger structure FS may include 1 to 4, or 6 or more string units SU.

Each finger structure FS includes a plurality of conductive layers 110 arranged in the Z direction, an interconnect layer 112 provided below the conductive layers 110, and a plurality of semiconductor pillars 120 extending in the Z direction. As shown in FIG. 5, a gate insulating film 130 is provided between each semiconductor pillar 120 and the conductive layers 110.

Each conductive layer 110 has a generally plate-like shape extending in the X direction. Each conductive layer 110 may include a stacked film comprising a barrier conductive film of titanium nitride (TiN) or the like and a metal film of tungsten (W) or the like. Each conductive layer 110 may comprise polysilicon containing an impurity such as phosphorus (P) or boron (B). Insulating layers 101 of silicon oxide (SiO2) or the like are provided between the conductive layers 110 arranged in the Z direction. Further, an insulating layer 102 of silicon oxide (SiO2) or the like is provided on the upper surface of the uppermost conductive layer 110.

In the NAND flash memory, the conductive layers 110 each function as a word line WL and gate electrodes of memory cells (memory transistors) connected thereto. Such conductive layers 110 are hereinafter sometimes referred to as conductive layers 110 (WL). The conductive layers 110 (WL) of one finger structure FS are electrically independent from those of any other finger structure FS. With reference to two finger structures FS adjacent to each other in the Y direction, the conductive layers 110 (WL) arranged in the Z direction and the insulating layers 101 provided on the upper and lower surfaces of the conductive layers 110, provided in one finger structure FS, are separated from those of the other finger structure FS in the Y direction by the inter-finger structure ST.

In the NAND flash memory, one or more conductive layers 110 (FIG. 2), located below the conductive layers 110 (WL), each function as a source-side select gate line SGS and gate electrodes of select transistors connected thereto. Such a conductive layer(s) 110 is hereinafter sometimes referred to as a conductive layer(s) 110 (SGS). With reference to two finger structures FS adjacent to each other in the Y direction, the one or more conductive layers 110 (SGS) and the insulating layers 101 provided on the upper and lower surfaces of the conductive layer(s) 110 (SGS), provided in one finger structure FS, are separated from those of the other finger structure FS in the Y direction by the inter-finger structure ST.

In the NAND flash memory, one or more conductive layers 110, located above the conductive layers 110 (WL), each function as a drain-side select gate line SGD and gate electrodes of select transistors connected thereto. Such a conductive layer(s) 110 is hereinafter sometimes referred to as a conductive layer(s) 110 (SGD).

As shown in FIG. 3, the Y-direction width YSGD of each conductive layer 110 (SGD) is smaller than the Y-direction width YWL of each conductive layer 110 (WL).

The conductive layers 110 (SGD) of one string unit SU are electrically independent from those of any other string unit SU. With reference to two string units SU adjacent to each other in the Y direction in each finger structure FS, the one or more conductive layers 110 (SGD), provided in one string unit SU, are separated from those of the other string unit SU in the Y direction by the inter-string unit insulating member SHE. With reference to two string units SU, which belong to two finger structures FS adjacent to each other in the Y direction and which are adjacent to each other via an inter-finger structure ST, the one or more conductive layers 110 (SGD) of one of the two string units SU are separated from those of the other string unit SU in the Y direction by the inter-finger structure ST.

The interconnect layer 112 (FIG. 2) may be, for example, polysilicon containing an N-type impurity such as phosphorus (P). A metal such as tungsten (W) or a conductive member of tungsten silicide or the like may be provided on the lower surface of the interconnect layer 112. The interconnect layer 112 functions as part of a source line SL in the NAND flash memory.

As shown in FIG. 3, the semiconductor pillars 120 are arranged in a predetermine pattern in the X and Y directions. For example, each finger structure FS includes twenty-four (24) semiconductor pillar rows SC provided in the area between one end to the opposite end in the Y direction. The twenty-four (24) semiconductor pillar rows each include a plurality of semiconductor pillars 120 arranged in the X direction. The semiconductor pillar rows are arranged at a pitch PSC in the Y direction. Thus, with reference to two semiconductor pillar rows SC adjacent to each other in the Y direction, the center position YSC of one semiconductor pillar row SC in the Y direction is separated from the center position YSC of the other semiconductor pillar row SC by a distance equal to the pitch PSC in the Y direction. The pitch PSC of the semiconductor pillar rows SC in the Y direction may be non-uniform in some examples.

The pitch PSC can be measured by various methods.

In an exemplary method, an XY planar cross-section as illustrated in FIG. 3 is observed by a method such as SEM or TEM and, the Y-direction center positions YSC of the semiconductor pillar rows SC in the same particular finger structure FS are measured. The distances between the center positions YSC are then measured, and the average value or the like of the measured distances is taken as the pitch PSC. In another exemplary method, the Y-direction center positions YSC of the four semiconductor pillar rows SC of a particular string unit SU are measured in XY cross-section. The three distances, corresponding to the four center positions YSC, are then measured, and the average value or the like of the measured distances is taken as the pitch PSC.

The center position YSC of a semiconductor pillar row SC can be determined by various methods. In an exemplary method, an XY cross-section as illustrated in FIG. 3 is observed by a method such as SEM or TEM and, in the XY cross-section, the Y-direction center position of at least one semiconductor pillar 120 of a particular semiconductor pillar row SC is measured. The measured center position of this one semiconductor pillar 120 or an average or other intermediate value of measured center positions can be taken as the center position YSC of the particular semiconductor pillar row SC. The center position of a semiconductor pillar 120 in the Y direction may be the Y-direction position of the center point of the circumscribed circle corresponding to the semiconductor pillar 120 or may be the Y-direction position of the on-image center of gravity of the semiconductor pillar 120.

A plurality of semiconductor pillars 120, belonging to each of the 1st to 4th, 6th to 9th, 11th to 14th, 16th to 19th, and 21st to 24th semiconductor pillar rows SC in each finger structure FS, as counted from the negative side (e.g., bottom of FIG. 3) along the Y direction, are electrically connected to bit lines BL by via contact electrodes Ch, Vy. Such a semiconductor pillar 120 functions as part of memory cells (memory transistors). On the other hand, the 5th, 10th, 15th and 20th semiconductor pillar rows SC in each finger structure FS are overlapped by the inter-string unit insulating members SHE when viewed in the Z direction and are not electrically connected to one of the bit lines BL. Such a semiconductor pillar 120 does not function as part of memory cells.

Those semiconductor pillars 120 which function as part of a memory cell will now be described.

Such semiconductor pillars 120 each include, for example, polysilicon (Si). As shown in FIG. 5, each semiconductor pillar 120 includes a region 121 facing the conductive layers 110, and a region 122 provided above the conductive layers 110.

As shown in FIG. 5, the region 121 has a generally cylindrical shape. An insulator pillar 125 of silicon oxide ($SiO_2$) or the like is provided in the center of the region 121. The region 121 functions as a channel region of memory cells and select transistors. The peripheral surface of the region 121 is in contact with the gate insulating film 130.

The region 122 contains an N-type impurity, such as phosphorus (P), and is connected to the lower end of a via contact electrode Ch. The lower end of the region 122 is in contact with the upper end of the insulator pillar 125. The upper end of the region 122 is located above the upper surface of the stopper insulating layer 103. The peripheral surface of a portion of the region 122 is in contact with the gate insulating film 130. The peripheral surface of an upper portion of the region 122 is in contact with the stopper insulating layer 103. The peripheral surface of a more upper portion and the upper surface of the region 122 are at least partly in contact with the via contact electrode Ch.

A portion of the region 122 from the lower end to a height position corresponding to the upper surface of the insulating layer 102 has a generally cylindrical shape. A portion of the region 122 from the height position corresponding to the upper surface of the insulating layer 102 to the upper end has a generally conical shape whose diameter (in an XY cross-section) decreases along the upward direction. For example, the diameter W122M of a portion at a height position corresponding to the upper surface of the stopper insulating layer 103 is smaller than the diameter W122B of a portion at a height position corresponding to the lower surface of the stopper insulating layer 103. Further, the diameter W122T of the upper end of the region 122 is smaller than the diameter W122M of a portion at a height position corresponding to the upper surface of the stopper insulating layer 103.

Those semiconductor pillars 120 which do not function as part of memory cells will now be described. Such a semiconductor pillar 120 has the same basic construction as the ones which function as part of memory cells except that an upper region of the semiconductor pillar 120 (for example, a portion located above the height position of the upper surface of the uppermost conductive layer 110 (WL)) is divided in the Y direction by the inter-string unit insulating member SHE.

The gate insulating film 130 has a generally cylindrical shape that covers the peripheral surface of each semiconductor pillar 120. As shown in FIG. 6, the gate insulating film 130 includes a tunnel insulating film 131, a charge storage film 132 and a block insulating film 133, which are stacked between each semiconductor pillar 120 and the conductive layers 110. The tunnel insulating film 131 and the block insulating film 133 each include, for example, silicon oxide ($SiO_2$). The charge storage film 132 is a film capable of storing charge, for example a film of silicon nitride (SiN). The tunnel insulating film 131, the charge storage film 132 and the block insulating film 133 each have a generally cylindrical shape, and extend in the Z direction along the peripheral surface of each semiconductor pillar 120, excepting the area of contact between the semiconductor pillar 120 and the interconnect layer 112 (FIG. 2). In the example of FIG. 5, the height position of the upper end of the gate insulating film 130 approximately coincides with the height position of the upper surface of the insulating layer 102.

FIG. 6 illustrates an example in which the gate insulating film 130 includes the charge storage film 132 of silicon nitride or the like. However, in other examples, the charge storage film in the gate insulating film 130 may be a floating gate type of, for example, polysilicon containing an N-type or P-type impurity.

As shown in FIG. 5, the stopper insulating layer 103 of silicon nitride (SiN) or the like and an insulating layer 104 of silicon oxide ($SiO_2$) or the like are provided on the upper surface of the insulating layer 102. In some examples, the stopper insulating layer 103 may be a layer of silicon oxynitride (SiON).

As will be described with reference to FIG. 25, in a process for manufacturing the semiconductor memory device of this embodiment, contact holes ChA are formed at positions corresponding to the via contact electrodes Ch. The stopper insulating layer 103 functions as an etching stopper upon the formation of the contact holes ChA.

The stopper insulating layer 103, together with the conductive layers 110 (SGD), is separated by the inter-string unit insulating member SHE in the Y direction. The stopper insulating layer 103 includes a region RN provided within the range of a certain distance from each semiconductor pillar 120, and a region RF provided outside the range of a certain distance from each semiconductor pillar 120. The length ZRN of the region RN in the Z direction is larger than the length ZRF of the region RF in the Z direction. The lower surface of the regions RN, RF is formed generally flat along the upper surface of the insulating layer 102. The upper surface of the region RN is located above the upper surface of the region RF and below the upper end of each semiconductor pillar 120.

The region RN may be determined, for example, by the following method. With reference to two semiconductor pillars 120 adjacent to each other in the Y direction in a YZ cross-section, or to two semiconductor pillars 120 adjacent to each other in the X direction in an XZ cross-section, the maximum value, the minimum value, and the average value of the maximum and minimum values of the length of the stopper insulating layer 103 in the Z direction are measured in the area between two such adjacent semiconductor pillars 120. Next, two or more positions in the Y or X direction, at which the Z-direction length of the stopper insulating layer 103 has the average value, are measured. Next, the distance from one of the two semiconductor pillars 120 to the nearest one of the two or more positions is measured. Next, a portion of the stopper insulating layer 103, located at the distance from the semiconductor pillar 120 in the Y or X direction, is defined as the Y-direction or X-direction end of the region RN.

The region RF may be, for example, the entire region between two regions RN adjacent to each other in the Y direction in a YZ cross-section. The region RF may be, for example, the entire region between two regions RN adjacent to each other in the X direction in an XZ cross-section.

The length ZRN or ZRF may be, for example, an average value of the Z-direction length of the region RN or RF.

The side surface of the stopper insulating layer 103 in the Y direction is spaced apart from the inter-finger structure ST in the Y direction. When viewed in the Z direction, the conductive layers 110 have a portion that does not overlap with the stopper insulating layer 103.

In FIG. 4, the stopper insulating film 103 is separated into different portions in the Y direction by the inter-string unit insulating members SHE and the inter-finger structures ST. Within the same finger structure FS, the portion 103*a* is nearest an inter-finger structure ST on the positive Y direction side of the finger structure FS, the portion 103*b* is nearest an inter-finger structure ST on the negative Y direction side of finger structure FS, and the portions 103*c* are the other portions of the stopper insulating layer 103 between the portions 103*a* and 103*b* in the Y direction.

In FIG. 4, within the same finger structure FS, the semiconductor pillar row SCa is nearest the inter-finger structure ST on the positive Y direction side, the semiconductor pillar row SCb is nearest the inter-finger structure ST on the negative Y direction side, the other semiconductor pillar rows SC between semiconductor pillar rows SCa and SCb in the Y direction are labeled as semiconductor pillar rows SCc.

The Y-direction positive-side surface of the portion 103*a* of the stopper insulating layer 103 includes curved surfaces formed along the peripheral surfaces of the semiconductor pillars 120 of the semiconductor pillar row SCa. Each curved surface is formed along a circle around the center position of a corresponding semiconductor pillar 120. Therefore, when the X-direction center positions of the semiconductor pillars 120 of the semiconductor pillar row SCa are each represented by X120, and an intermediate position between two positions X120 adjacent to each other in the X direction is represented by X1120, points p1, corresponding to the positions X120, in the Y-direction positive-side surface of the portion 103*a* lie on the more positive side in the Y direction than points p2 corresponding to the positions X1120.

The Y-direction negative-side surface of the portion 103*b* of the stopper insulating layer 103 likewise includes curved surfaces formed along the peripheral surfaces of the semiconductor pillars 120 of the semiconductor pillar row SCb.

As shown in FIGS. 2 and 5, each inter-string unit insulating member SHE extends in the X and Z directions and separates, in the Y direction, the insulating layer 104, the stopper insulating layer 103, the insulating layer 102, the conductive layers 110 (SGD), and the insulating layers 101 provided on the upper and lower surfaces of the conductive layers 110 (SGD). Each inter-string unit insulating member SHE includes, for example, silicon oxide ($SiO2$). As shown in FIG. 5, the lower end of each inter-string unit insulating member SHE is located above the lower surface of the uppermost conductive layer 110 (WL) and below the lower surface of the lowermost conductive layer 110 (SGD).

As shown in FIG. 5, each inter-finger structure ST includes an inter-finger electrode 141 extending in the X and Z directions, and inter-finger insulating members 142 of silicon oxide ($SiO2$) or the like, provided on both Y-direction side surfaces of the inter-finger electrode 141. As shown in FIG. 2, the lower ends of the inter-finger electrode 141 and the inter-finger insulating members 142 are connected to the interconnect layer 112. In the example of FIG. 5, the Z-direction positions of the upper ends of the inter-finger electrode 141 and the inter-finger insulating members 142 approximately coincide with the Z-direction position of the upper surface of the insulating layer 104. The inter-finger electrode 141 may be a conductive member including, for example, a stacked film having a barrier conductive film of titanium nitride (TiN) or the like and a metal film of tungsten (W) or the like. The inter-finger electrode 141 may also be a semiconductor material including such as polysilicon containing an impurity such as phosphorus (P) or boron (B). The inter-finger electrode 141 may include both a conductive member and a semiconductor member. The inter-finger electrode 141 functions as part of a source line SL in the NAND flash memory.

As shown in FIG. 5, a stopper insulating layer 105 of silicon nitride (SiN) or the like and an insulating layer 106 of silicon oxide ($SiO2$) or the like are provided on the upper surfaces of the insulating layer 104, the inter-string unit insulating members SHE, and the inter-finger structure ST. In other examples, stopper insulating layer 105 may be a layer of silicon oxynitride (SiON).

As shown in FIG. 5, an insulating layer 107 is provided on the peripheral surface of each via contact electrode Ch. The via contact electrodes Ch and the insulating layers 107 extend in the Z direction and penetrate the insulating layer 106, the stopper insulating layer 105 and the insulating layer 104, and are connected, at their lower ends, to the upper ends of the semiconductor pillars 120 and the upper surface of the stopper insulating layer 103.

In this embodiment, the diameter (in an XY cross-section) of the lower end of each via contact electrode Ch is larger than the diameter of the upper end of the semiconductor pillar 120. Further, the diameter WCh of the via contact electrode Ch at the height position of the upper end of the semiconductor pillar 120 is larger than the diameter W122T of the upper end of the semiconductor pillar 120.

As shown in FIG. 4, following the pattern of the semiconductor pillars 120, the via contact electrodes Ch are arranged in a predetermined pattern in the X and Y directions. In the example of FIG. 4, the Y-direction center position of each via contact electrode Ch substantially coincides with the Y-direction center position of the corresponding semiconductor pillar 120. However, the Y-direction center position of the via contact electrodes Ch for the semiconductor pillar row SCa (which is the pillar row nearest the inter-finger structure ST on the negative Y-side of the inter-finger structure ST) are offset in the negative Y direction from the Y-direction center position of the semiconductor pillar row SCa. The Y-direction center positions of the via contact electrodes Ch for the semiconductor pillar row SCb (which is the pillar row nearest the inter-finger structure ST on the positive Y-side of the inter-finger structure ST) are offset in the positive Y direction from the Y-direction center position of the semiconductor pillar row SCb.

The Y-direction center position of a via contact electrode Ch may be determined by a similar method as described for determining the Y-direction center position of a semiconductor pillar 120. Likewise, the Y-direction center position of a plurality of via contact electrodes Ch arranged in the X direction may be determined by a similar method as described for determining the Y-direction center position of a semiconductor pillar row SC.

As shown in FIG. 3, the bit lines BL extend in the Y direction and are arranged at intervals in the X direction. The X-direction pitch of the bit lines BL is ¼ times the X-direction pitch of the semiconductor pillars 120 arranged in the X direction. The bit lines BL may include a stacked film, for example, having a barrier conductive film of titanium nitride (TiN) or the like and a metal film of copper (Cu) or the like. Via contact electrodes Vy are interposed between the bit lines BL and the via contact electrodes Ch. When viewed in the Z direction, the via contact electrodes Vy are located at positions overlapping the bit lines BL and the via contact electrodes Ch.

[Manufacturing Method]

A method for manufacturing the semiconductor memory device of this embodiment will now be described with reference to FIGS. 7 through 25. FIGS. 7 through 25 are schematic cross-sectional views corresponding to FIG. 5 and illustrating the manufacturing method.

Figure 7:
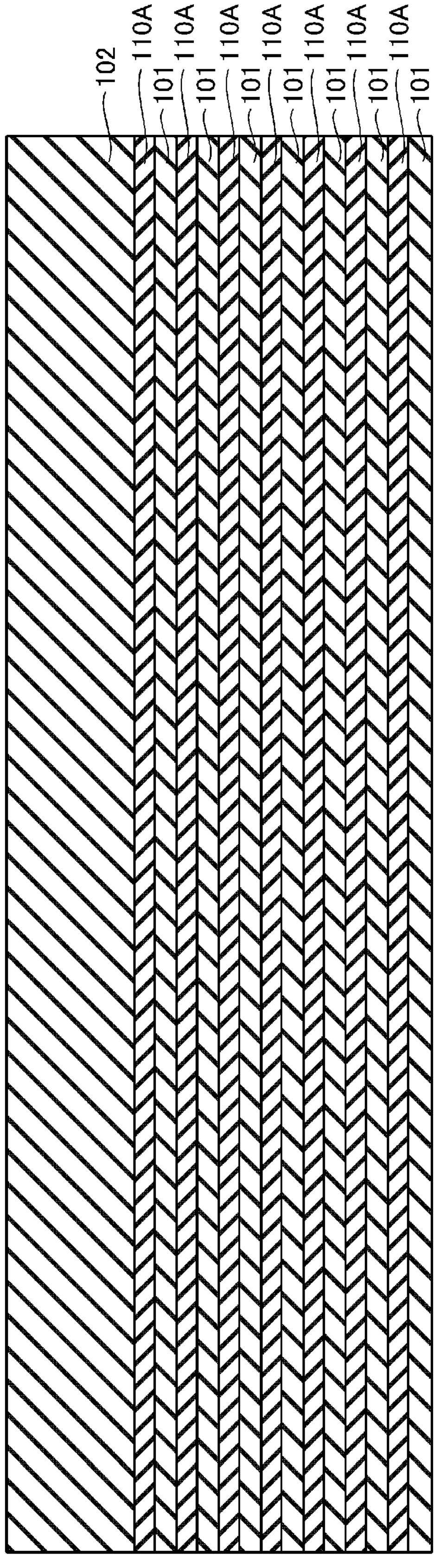
Figure 7:
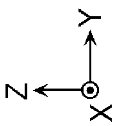

In the manufacturing of the semiconductor memory device of this embodiment, a plurality of insulating layers 101 and a plurality of sacrificial layers 110A are formed alternately as shown in FIG. 7. An insulating layer 102 is formed on the upper surface of the uppermost sacrificial layer 110A. The sacrificial layers 110A include, for example, silicon nitride (SiN). This process step is performed by a method such as CVD (Chemical Vapor Deposition).

Figure 8:
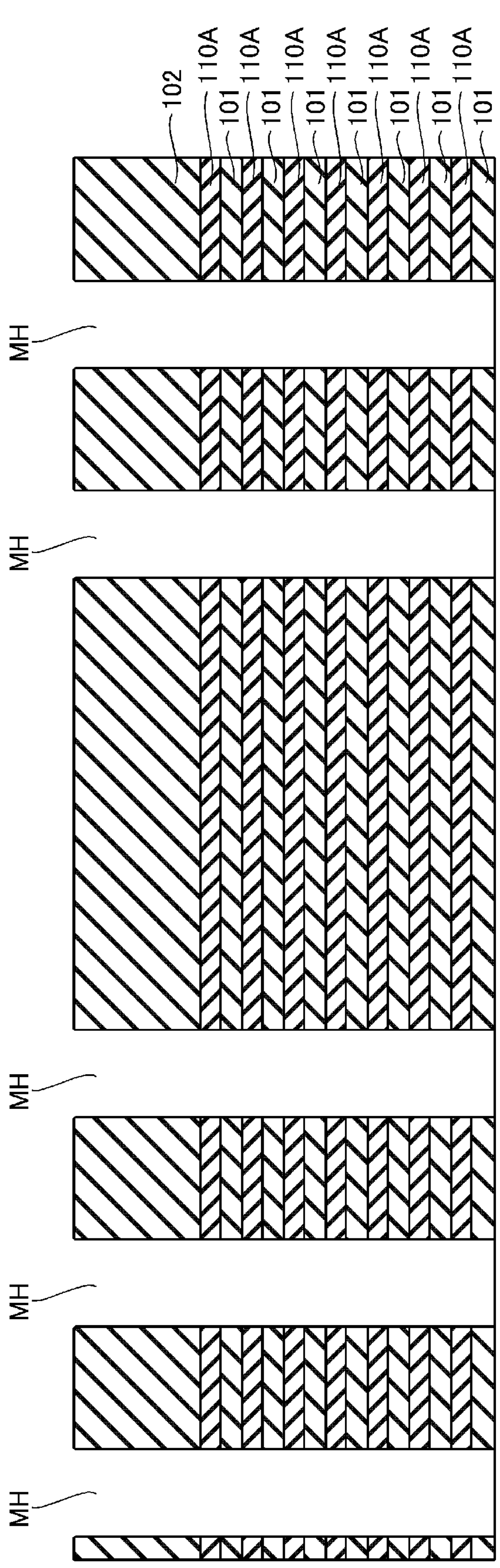

Next, as shown in FIG. 8, a plurality of memory holes MH are formed at positions ultimately corresponding to semiconductor pillars 120. The memory holes MH extend in the Z direction and penetrate the insulating layer 102, and the insulating layers 101 and the sacrificial layers 110A arranged in the Z direction. This process step is performed by a method such as reactive ion etching (RIE).

Figure 9:
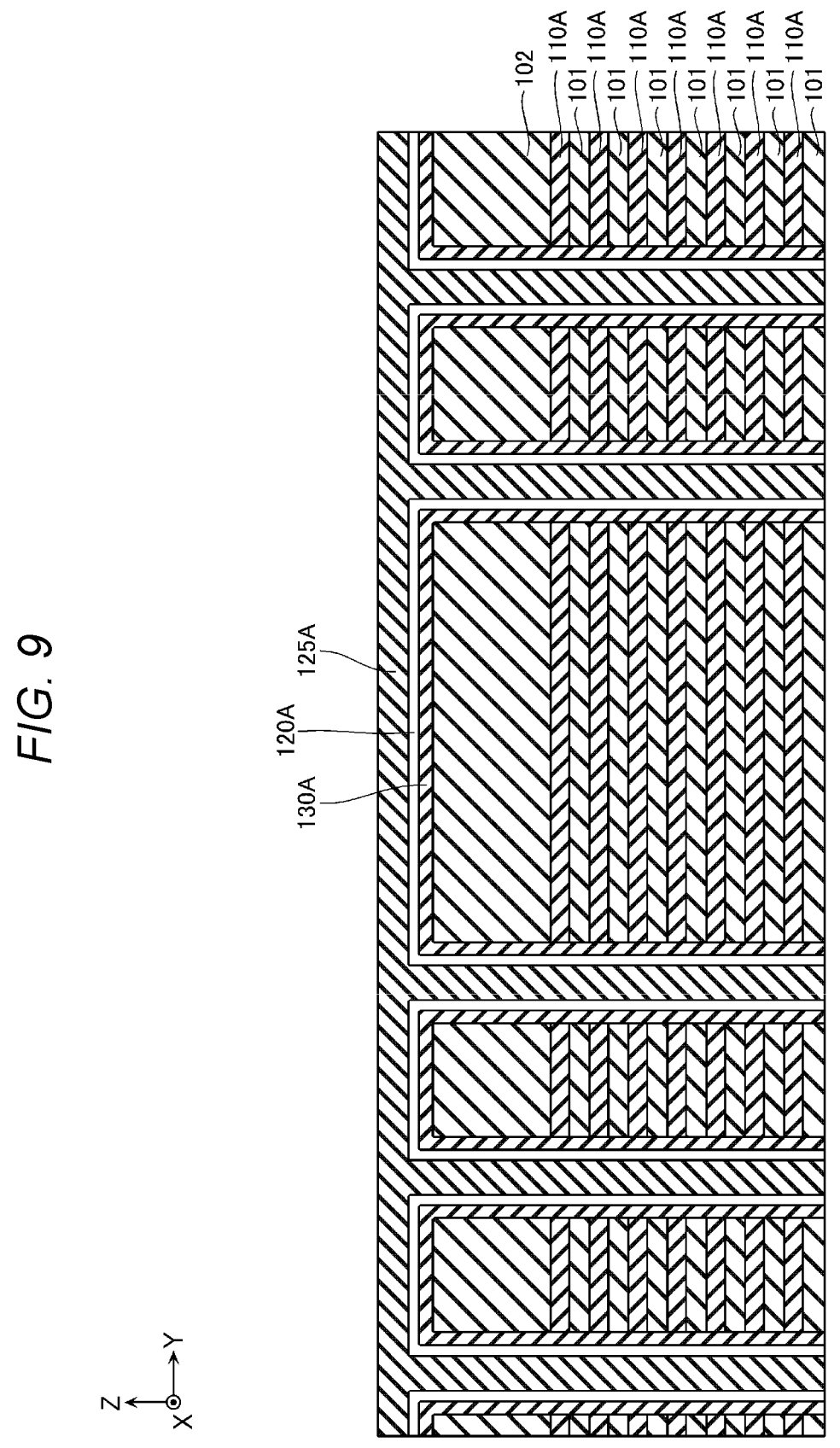

Next, as shown in FIG. 9, an insulating film 130A, a semiconductor layer 120A, and an insulating layer 125A are formed on the inner peripheral surfaces of the memory holes MH and the upper surface of the insulating layer 102. This process step is performed by, for example, CVD.

Figure 10:
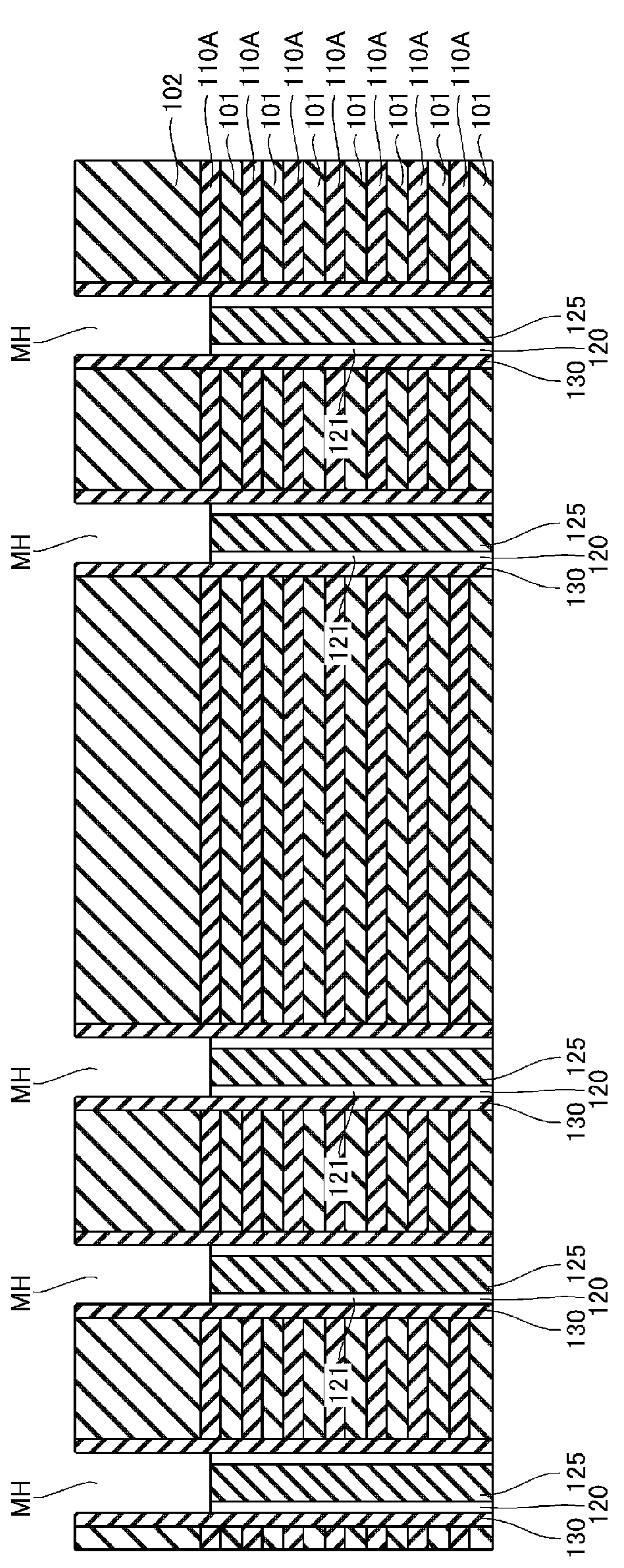

Next, as shown in FIG. 10, a part of the insulating layer 125A, the semiconductor layer 120A, and the insulating film 130A are removed to form regions 121 of semiconductor pillars 120, gate insulating films 130, and insulator pillars 125. This process step is performed by, for example, RIE.

Figure 11:
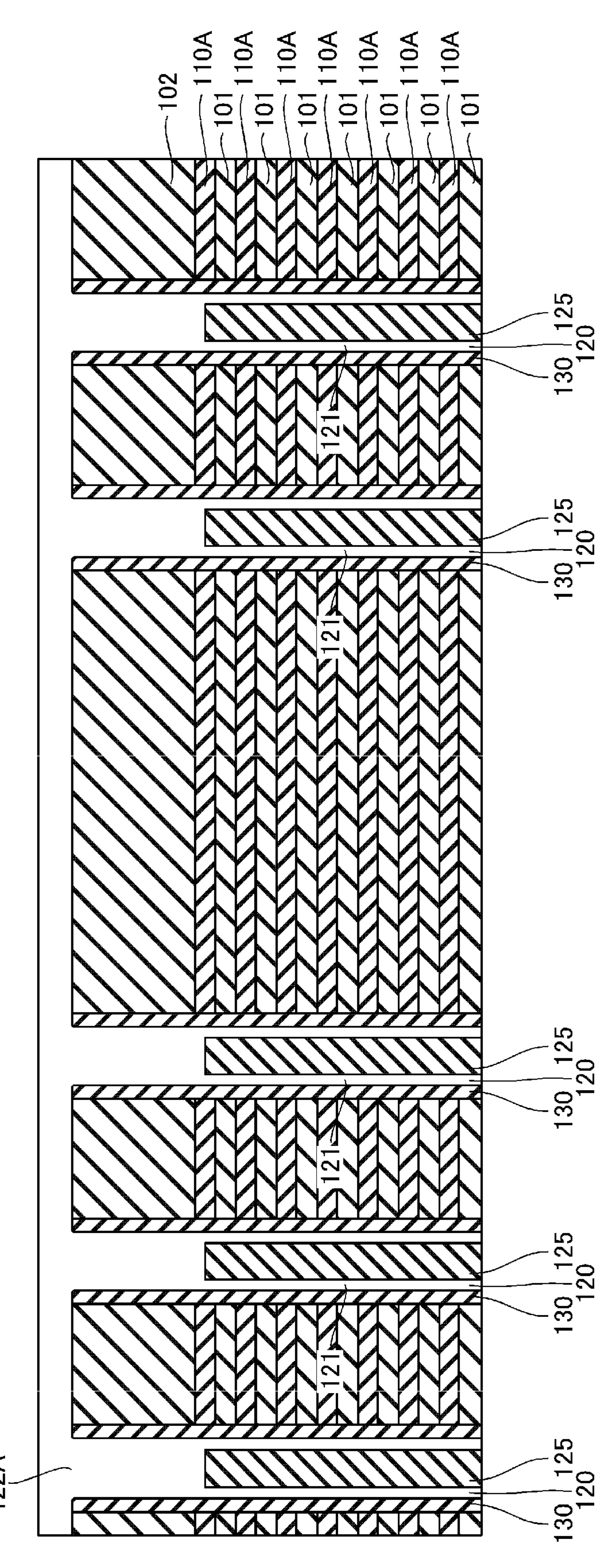

Next, as shown in FIG. 11, a semiconductor layer 122A is formed on the inner peripheral surfaces of the memory holes MH and the upper surface of the insulating layer 102. This process step is performed by, for example, CVD.

Figure 12:
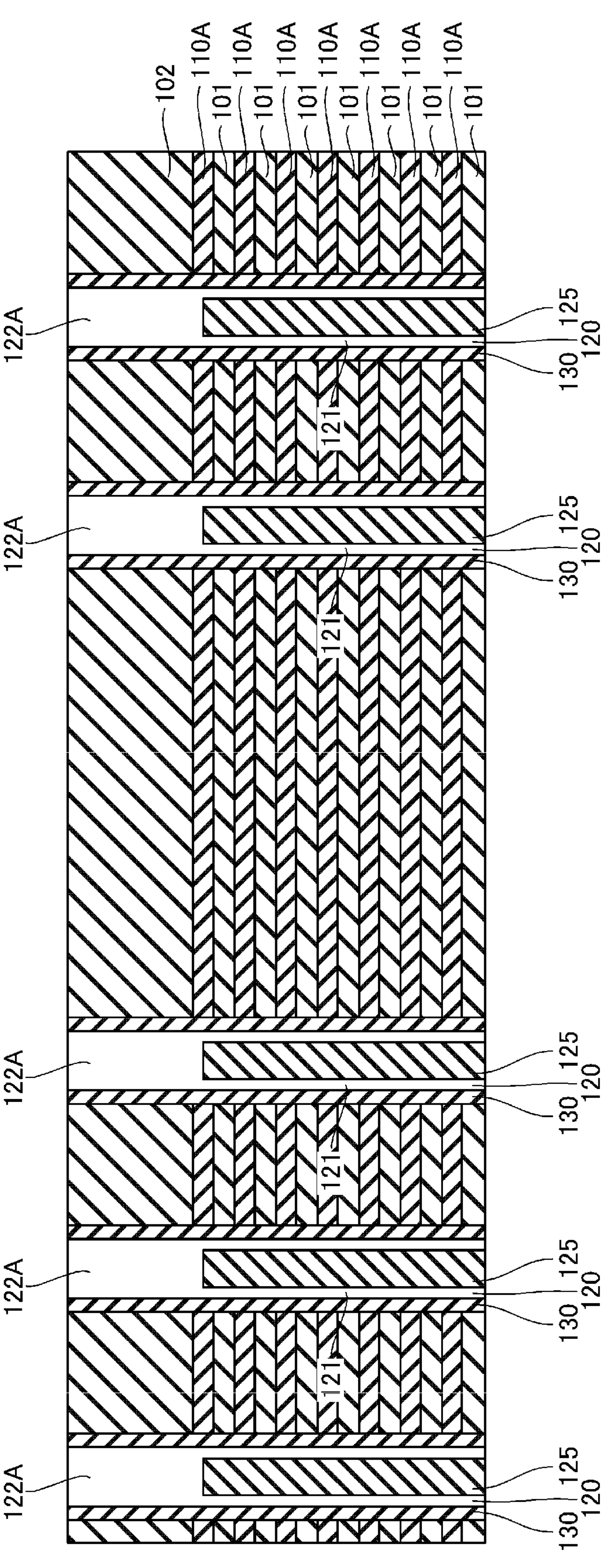

Next, as shown in FIG. 12, a portion of the semiconductor layer 122A, formed over the upper surface of the insulating layer 102, is removed, whereby the semiconductor layer 122A is separated into portions corresponding to the memory holes MH. This process step is performed by, for example, RIE.

Figure 13:
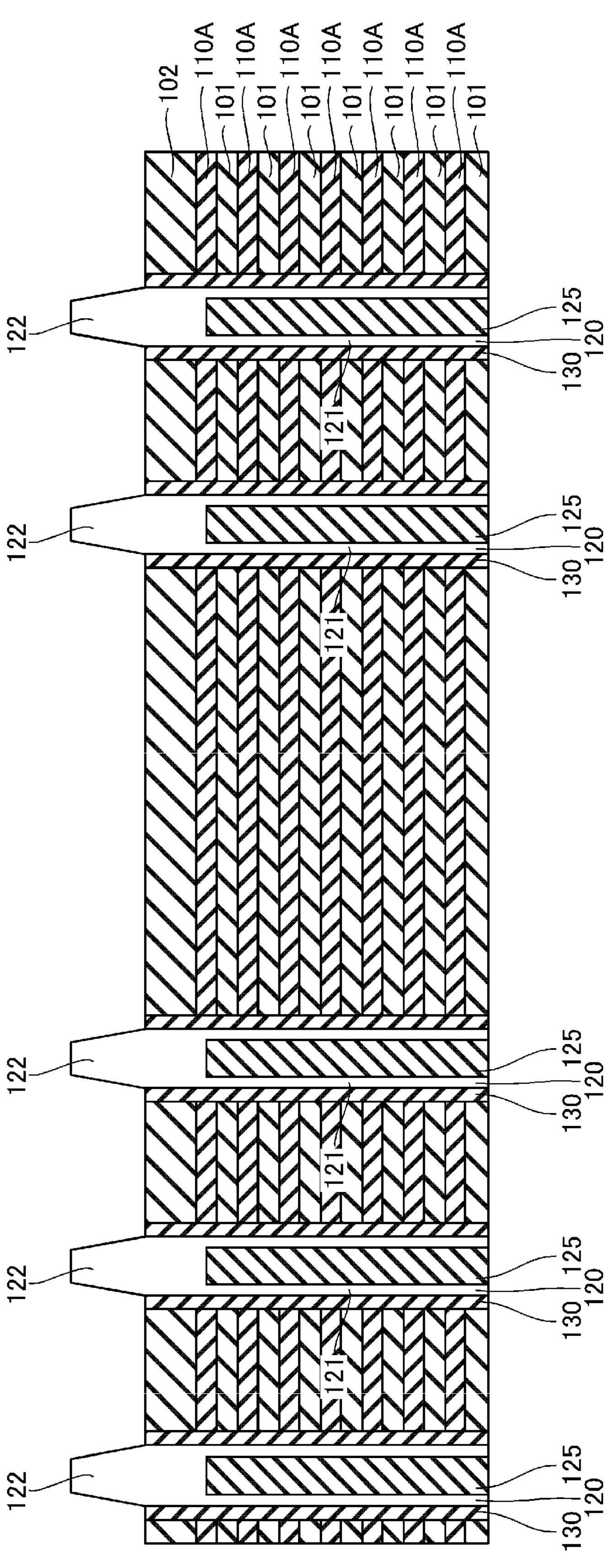
Figure 13:
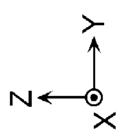

Next, as shown in FIG. 13, the insulating layer 102 and the gate insulating films 130 are partly removed to expose a part of the peripheral surface of each semiconductor layer 122A. This process step is performed by, for example, RIE. Regions 122 of semiconductor pillars 120 are formed in this step.

Figure 14:
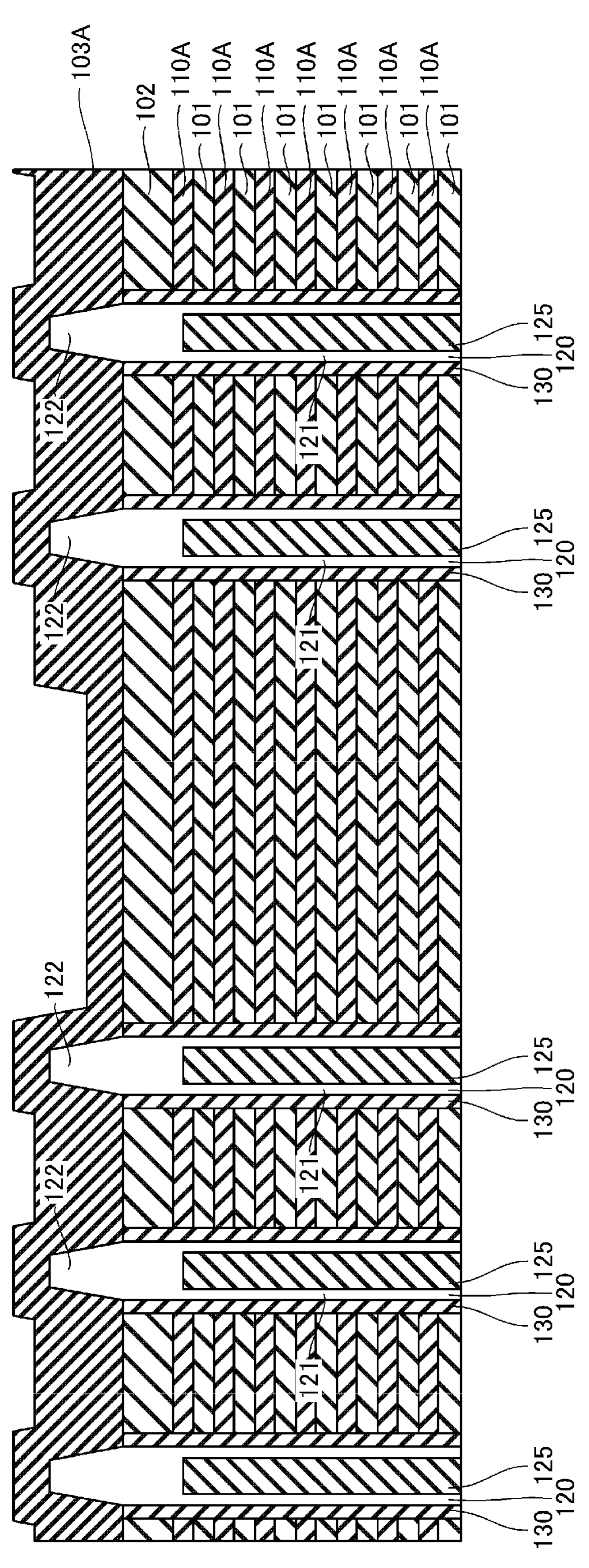

Next, as shown in FIG. 14, an insulating layer 103A is formed on the upper surface of the insulating layer 102 and on the peripheral surfaces and the upper surfaces of the regions 122 of semiconductor pillars 120. This process step is performed by, for example, chemical vapor deposition (CVD).

In this step, as shown in FIG. 14, the Z-direction thickness of the insulating layer 103A in an area around an inter-finger structure ST is made smaller than the Z-direction thickness of the insulating layer 103A in the other area. The thickness of the insulating layer 103A is adjusted so that the area between the semiconductor pillars 120 of a finger structure FS will be embedded in a portion of the insulating layer 103A which is to be formed around the peripheral surfaces of the semiconductor pillars 120. For example, when the semiconductor pillars 120 are arranged in a pattern in which, as shown in FIG. 4, any semiconductor pillar 120 is located at a vertex of an equilateral triangle, the thickness of the insulating layer 103A is made larger than the distance from the peripheral surface of a semiconductor pillar 120 to the center position of a relevant equilateral triangle.

Figure 15:
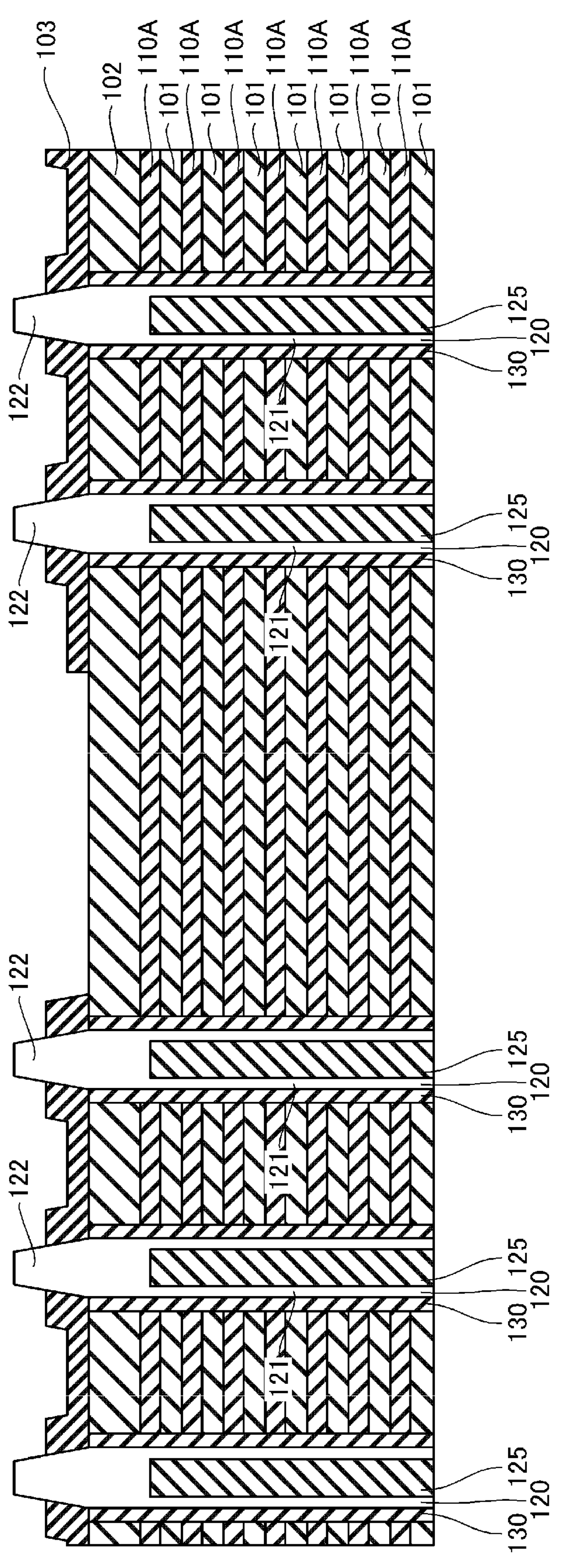
Figure 15:
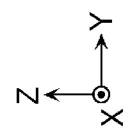

Next, as shown in FIG. 15, the insulating layer 103A is partly removed to expose the upper surface of the insulating layer 102 and the regions 122 of the semiconductor pillars 120, thereby forming a stopper insulating layer 103. In this step, a portion of the insulating layer 103A, formed in an area around an inter-finger structure ST, is removed, while a portion of the insulating layer 103A, formed in the other area, remains unremoved. This process step is performed by, for example, RIE.

In this step, a portion of the insulating layer 103A, formed around the peripheral surfaces of the semiconductor pillars 120, remains unremoved. Accordingly, as described above with reference to FIG. 4, in the side surfaces of the insulating layer 103A, facing each other in the Y direction, curved surfaces are formed along the peripheral surfaces of the semiconductor pillars 120 of the semiconductor pillar rows SCa, SCb.

Figure 16:
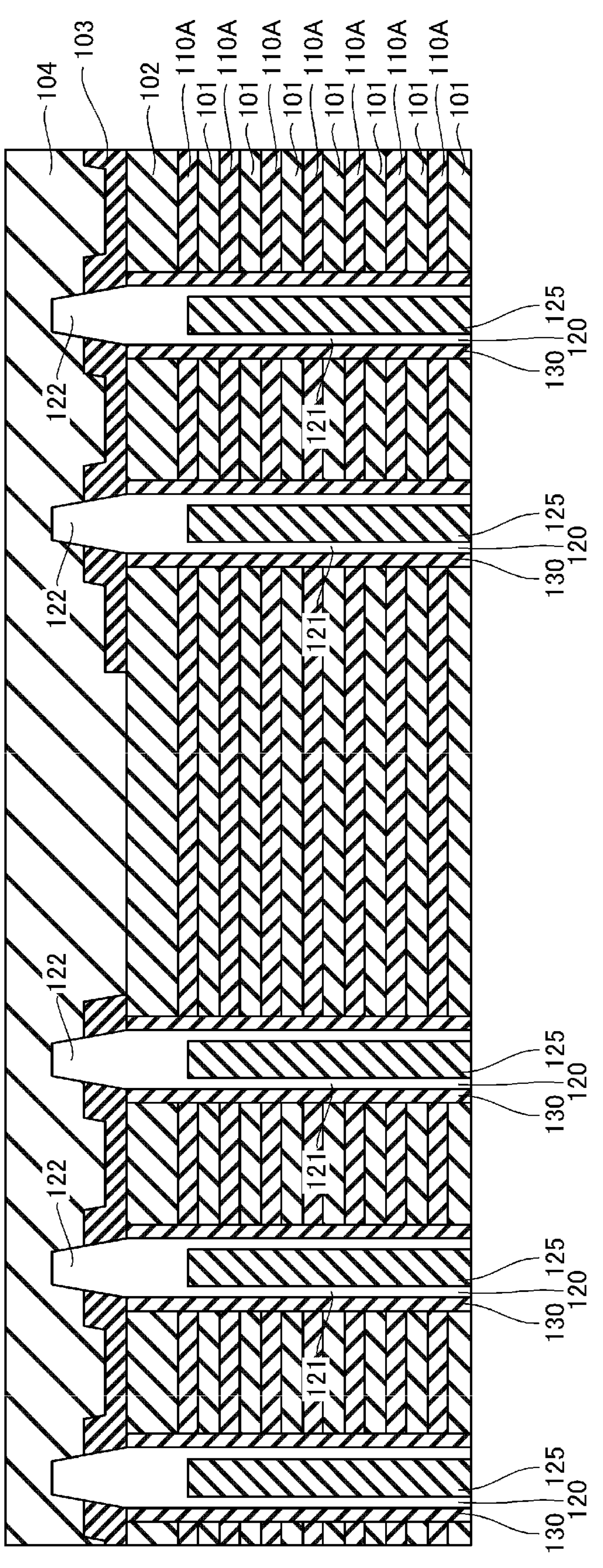
Figure 16:
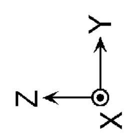

Next, as shown in FIG. 16, an insulating layer 104 is formed. This process step is performed by, for example, CVD.

Figure 17:
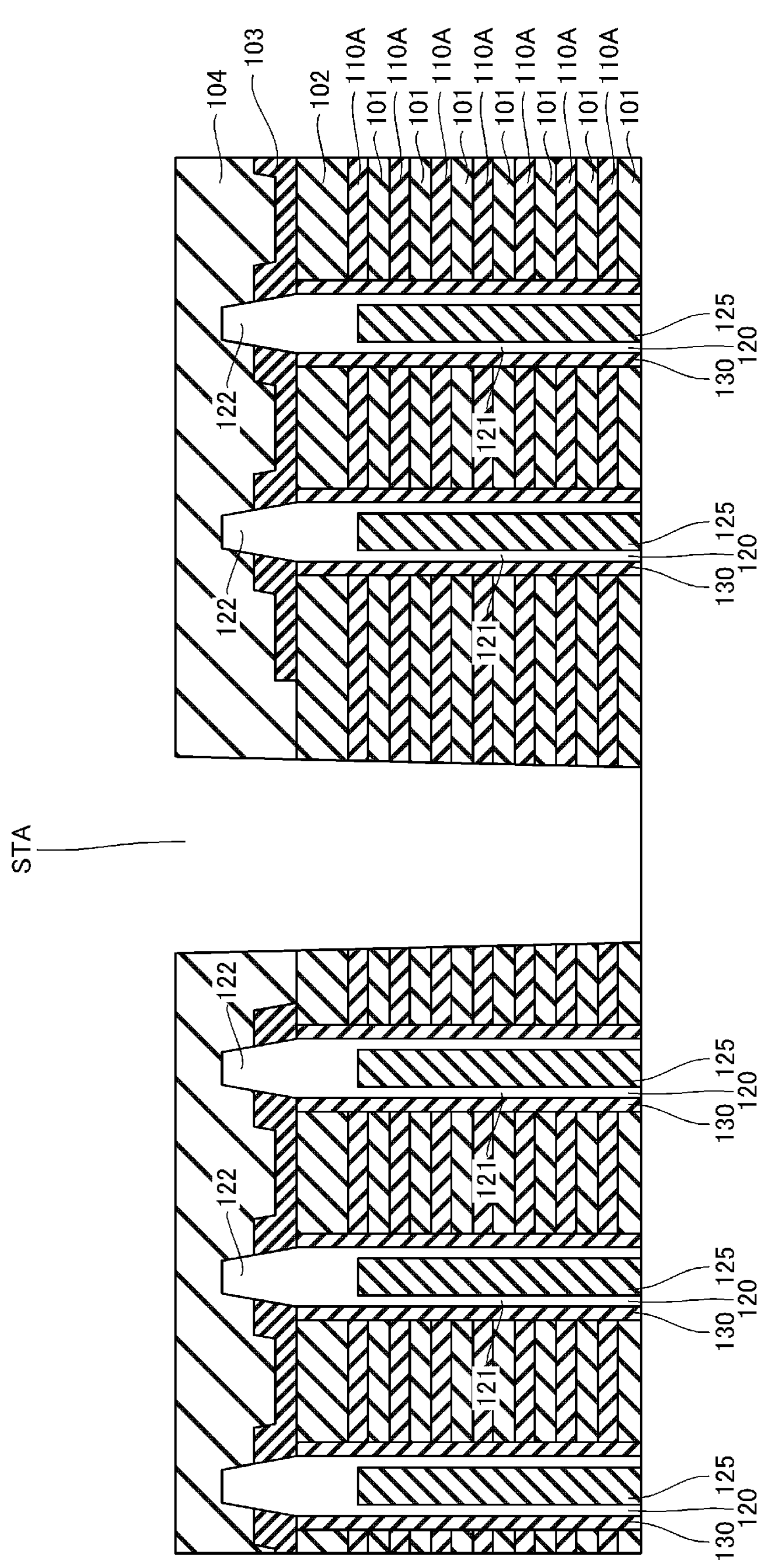

Next, as shown in FIG. 17, a trench STA is formed at a position corresponding to an inter-finger structure ST. The trench STA extends in the X and Z directions, and separates the insulating layer 104, the insulating layer 102, the insulating layers 101 and the sacrificial layers 110A in the Y direction. This process step is performed by, for example, RIE. The trench STA is located away from the stopper insulating layer 103 in the Y direction. Thus, the stopper insulating layer 103 is not exposed in the trench STA.

Figure 18:
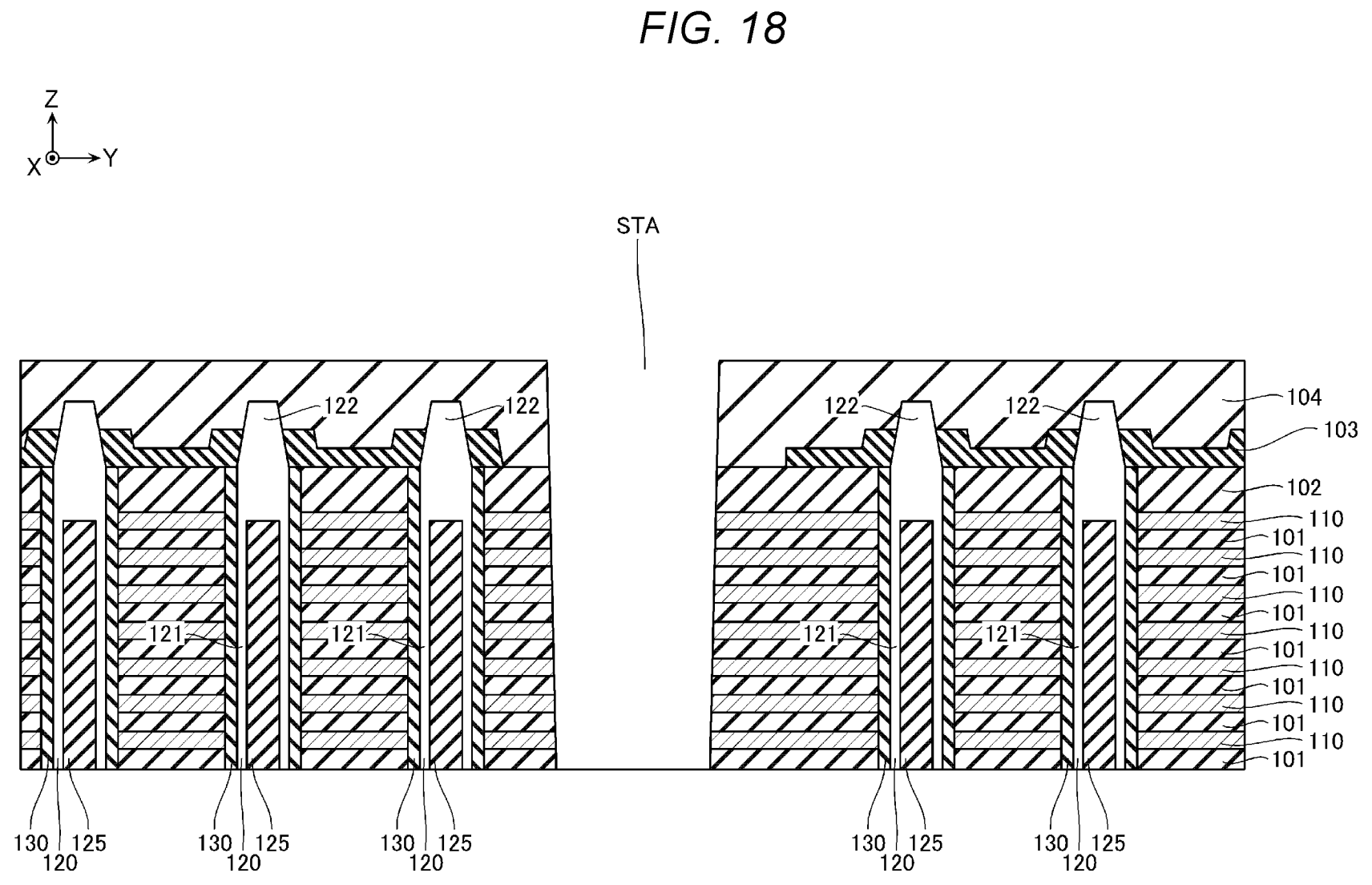

Next, as shown in FIG. 18, conductive layers 110 are formed. In this step, the sacrificial layers 110A are removed through the trench STA to form cavities arranged in the Z direction. This process step is performed by a method such as wet etching. Subsequently, conductive layers 110 are formed in the cavities arranged in the Z direction. This process step is performed by a method such as CVD.

As with the sacrificial layers 110A, the stopper insulating layer 103 includes silicon nitride (SiN) or the like. However, the stopper insulating layer 103 is not exposed in the trench STA during the step of removing the sacrificial layers 110A. Therefore, the stopper insulating layer 103 is not removed in the step.

Figure 19:
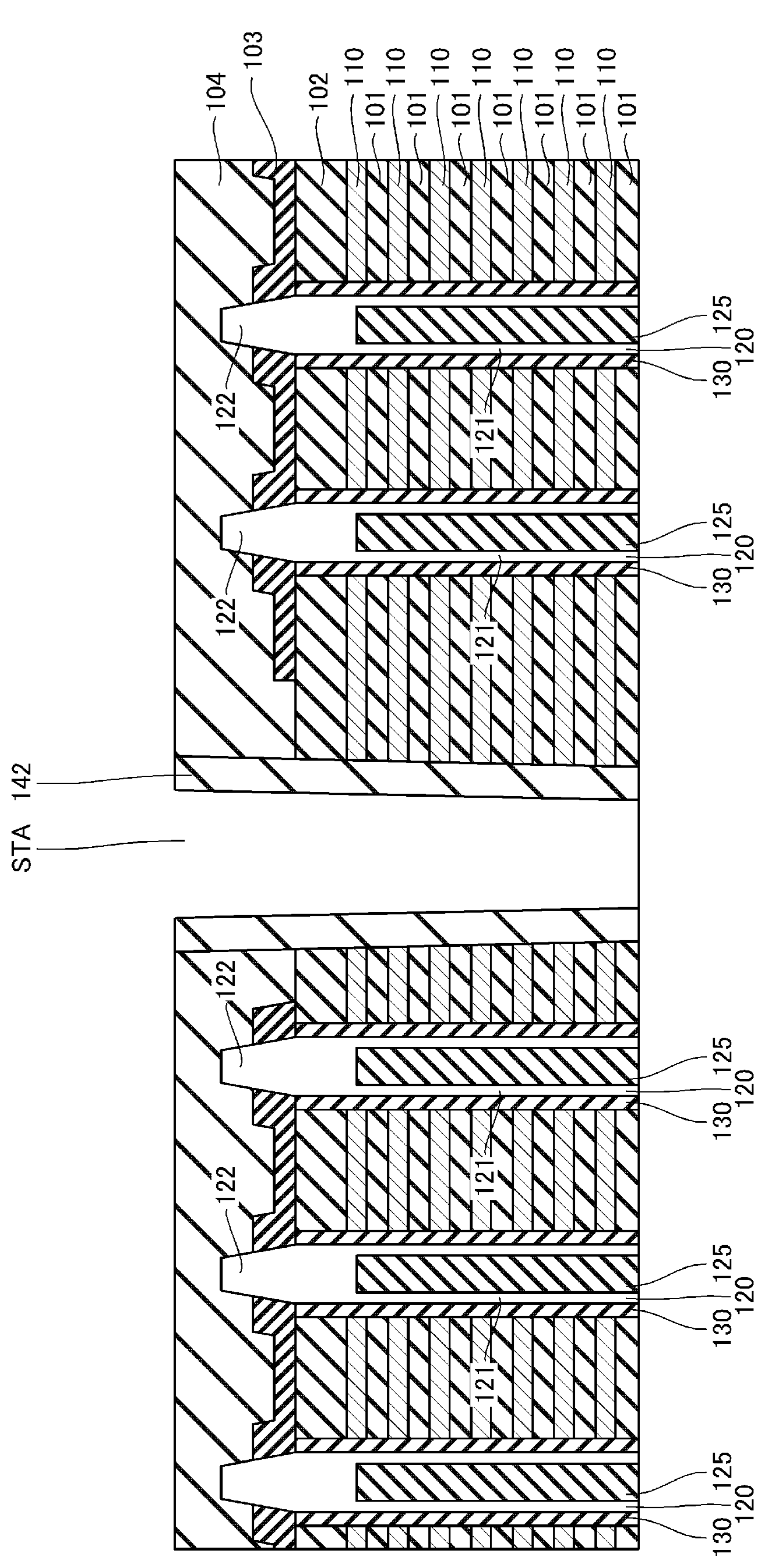

Next, as shown in FIG. 19, inter-finger insulating members 142 are formed on the Y-direction side surfaces of the trench STA. This process step is performed by a method such as CVD.

Figure 20:
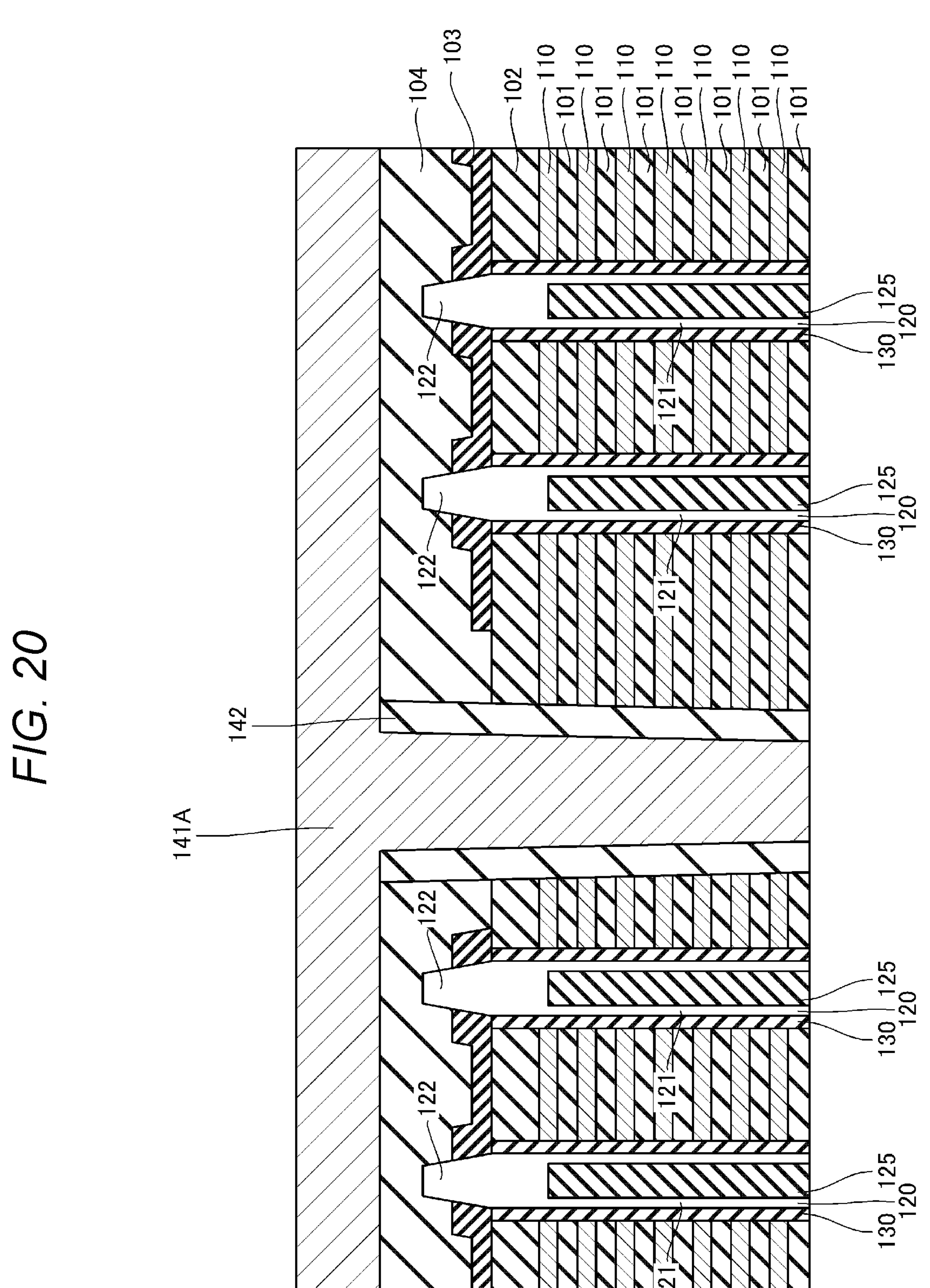

Next, as shown in FIG. 20, a conductive member 141A is formed on the upper surfaces of the insulating layer 104 and the inter-finger insulating members 142 and in the trench STA. This process step is performed by a method such as CVD.

Figure 21:
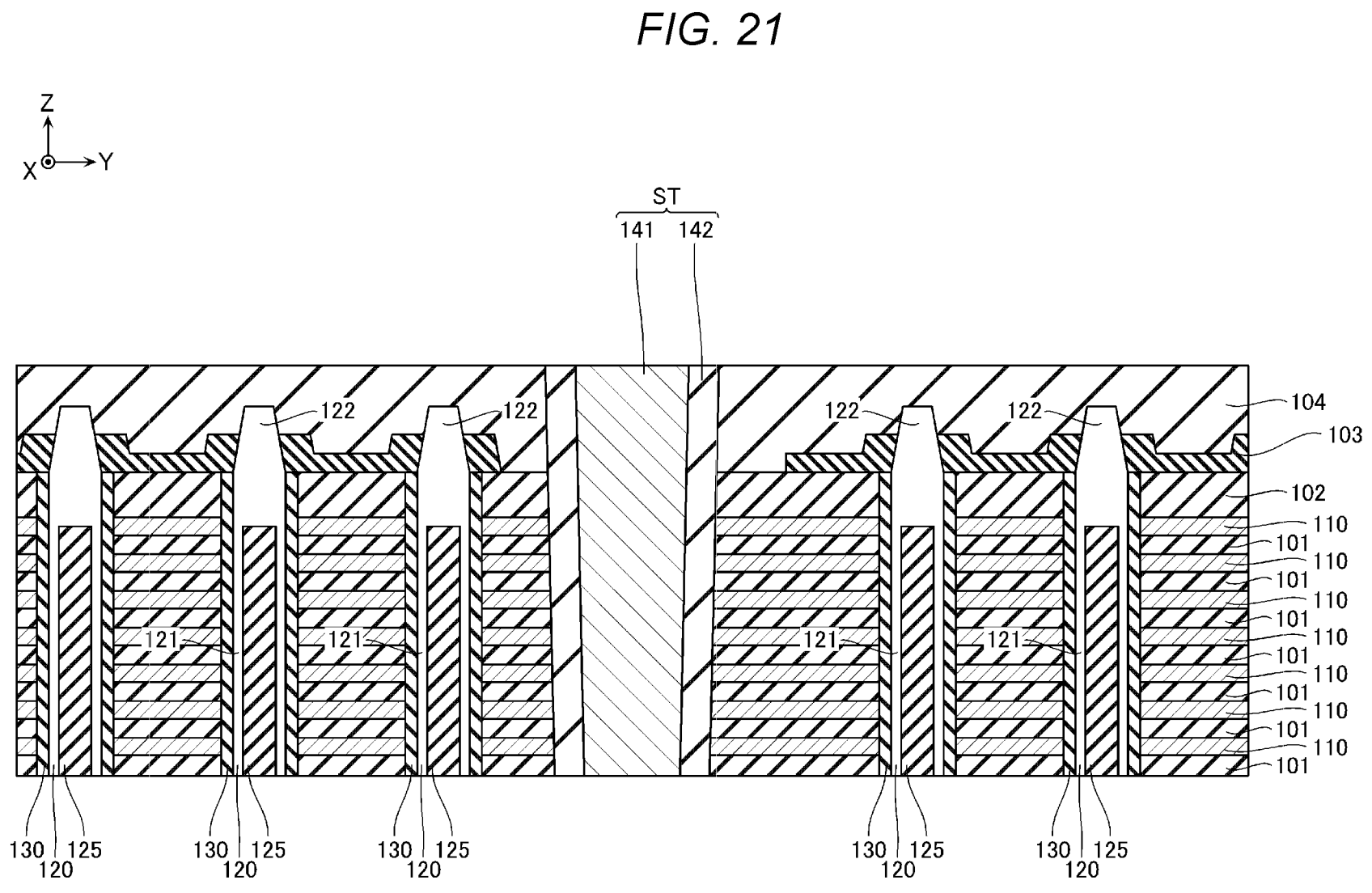

Next, as shown in FIG. 21, the conductive member 141A is partly removed to expose the upper surface of the insulating layer 104. This process step is performed by a planarization method such as CMP (Chemical Mechanical Polishing). An inter-finger structure ST is formed in this step.

Figure 22:
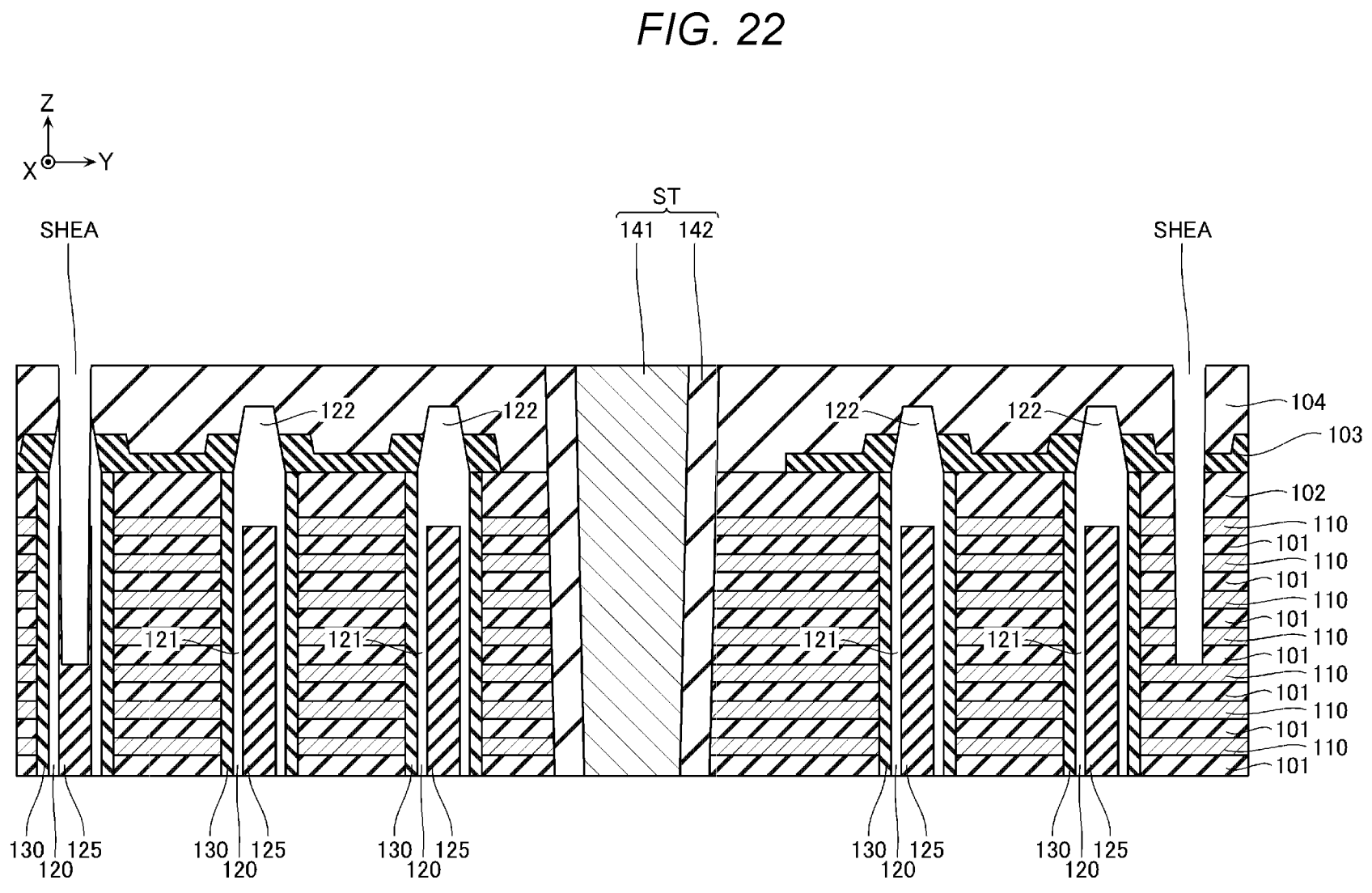

Next, as shown in FIG. 22, trenches SHEA are formed at positions corresponding to inter-string unit insulating members SHE. Each trench SHEA extends in the X and Z directions and separates, in the Y direction, the insulating layer 104, the stopper insulating layer 103, the insulating layer 102, the conductive layers 110 (SGD) and the insulating layers 101 provided therebetween. This process step is performed by a method such as RIE.

Figure 23:
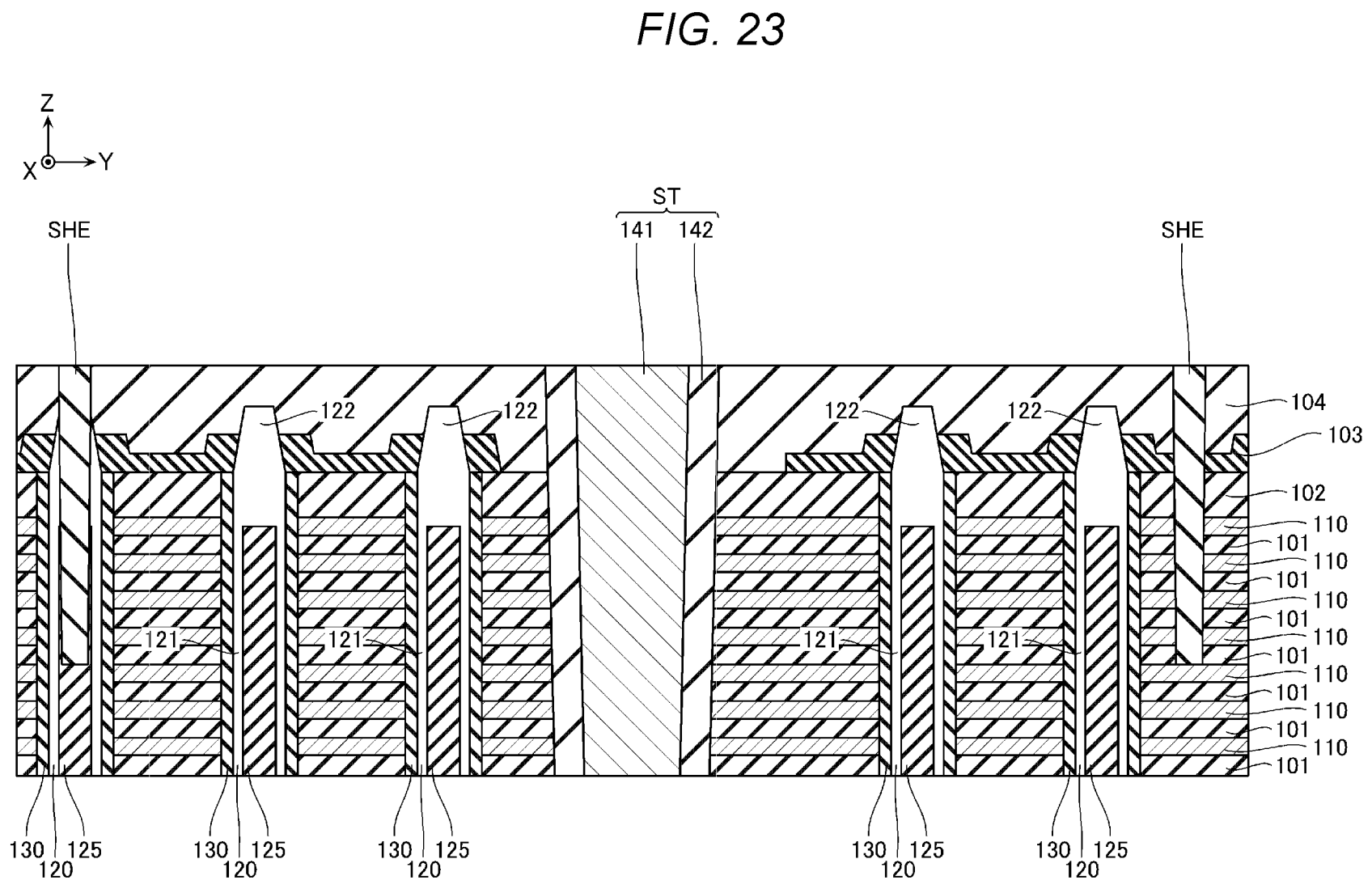

Next, as shown in FIG. 23, inter-string unit insulating members SHE are formed in the trenches SHEA. This process step is performed by a method such as CVD.

Figure 24:
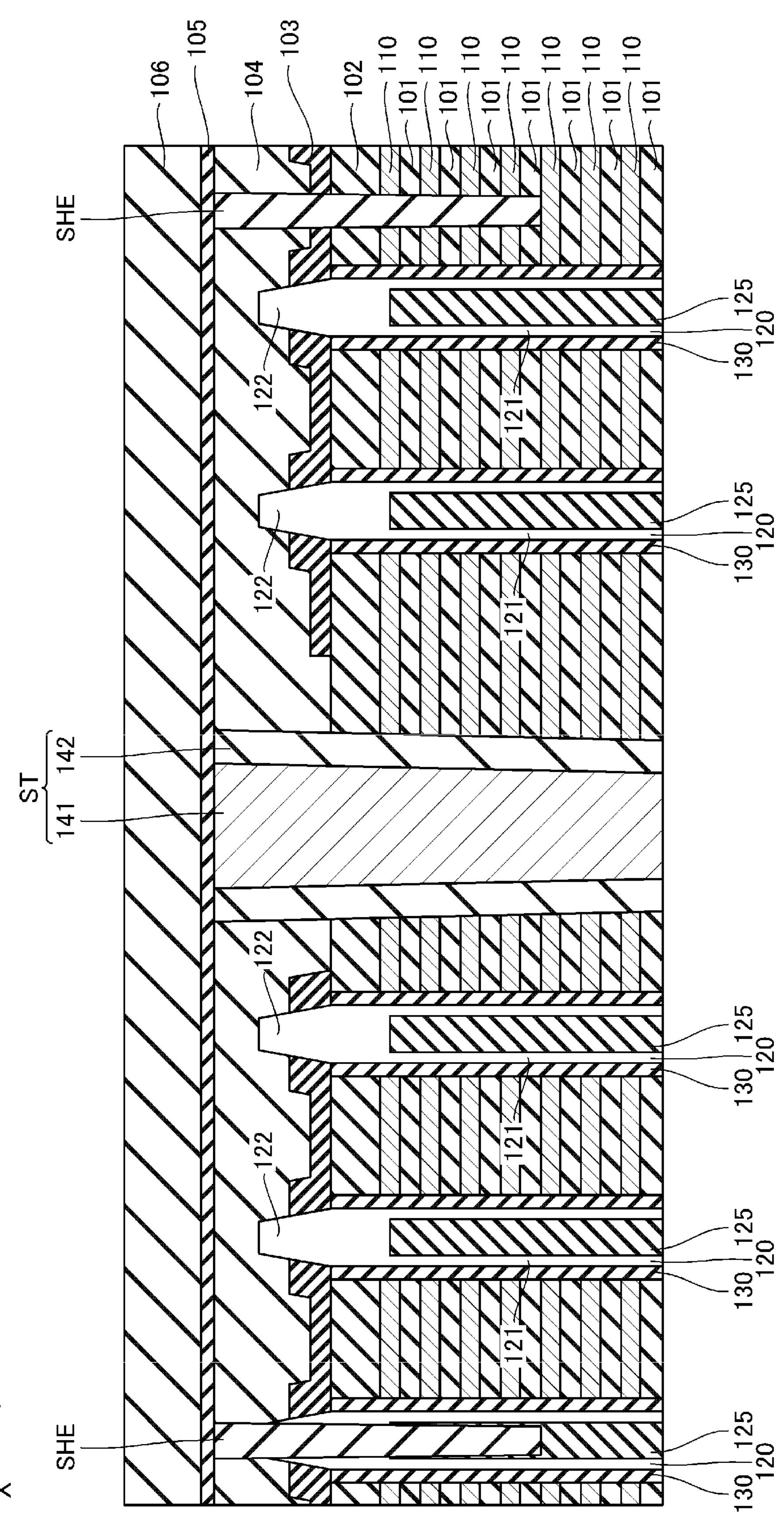

Next, as shown in FIG. 24, a stopper insulating layer 105 and an insulating layer 106 are formed on the upper surfaces of the insulating layer 104, the inter-finger structure ST and the inter-string unit insulating members SHE. This process step is performed by a method such as CVD.

Figure 25:
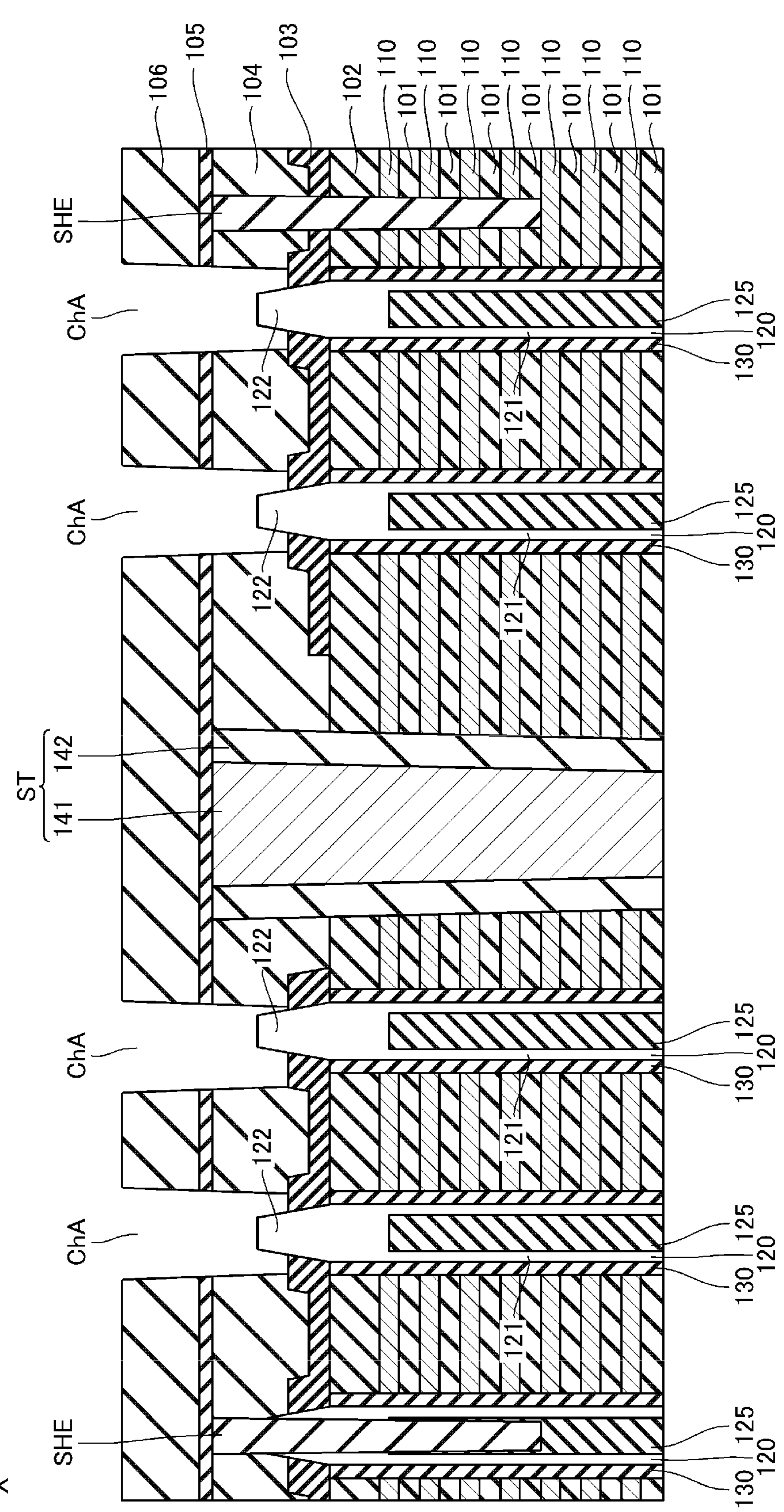

Next, as shown in FIG. 25, contact holes ChA are formed at positions corresponding to via contact electrodes Ch. The contact holes ChA extend in the Z direction and penetrate the insulating layer 106, the stopper insulating layer 105 and the insulating layer 104, thereby exposing the regions 122 of the semiconductor pillars 120 and the upper surface of the stopper insulating layer 103. This process step is performed, for example, by first performing RIE using the stopper insulating layer 105 as a stopper, removing the stopper insulating layer 105, and then performing RIE using the stopper insulating layer 103 as a stopper.

Next, as shown in FIG. 5, an insulating layer 107 and a via contact electrode Ch are formed in each contact hole ChA. This process step is performed by a method such as CVD.

Thereafter, the bit lines BL and the via contact electrodes Vy (which has been described above with reference to FIG. 3) are formed to complete the formation of the semiconductor memory device according to the first embodiment.

Comparative Example

Figure 26:
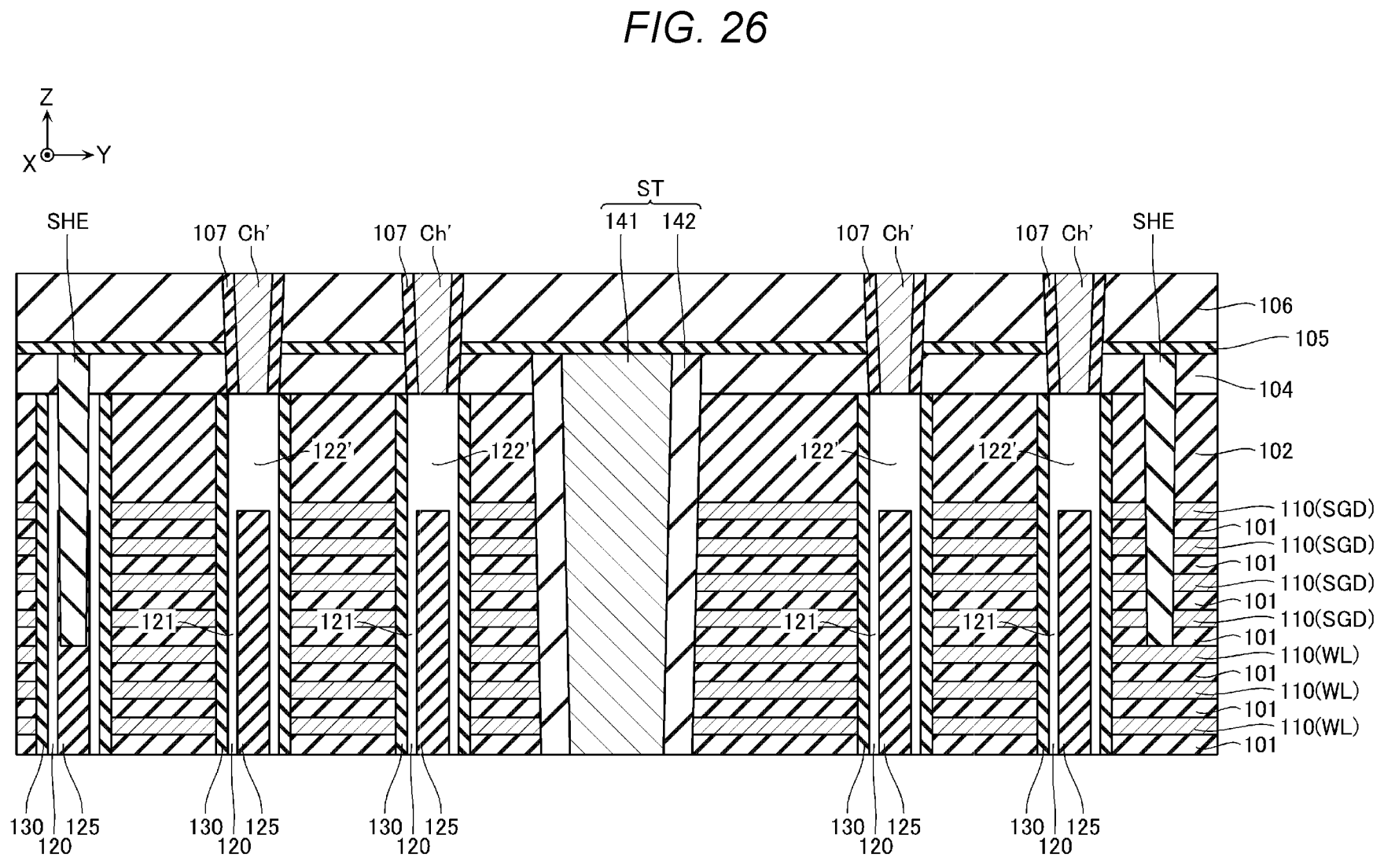

FIG. 26 is a schematic cross-sectional view showing a semiconductor memory device of a comparative example ("comparative semiconductor memory device").

The semiconductor memory device of this comparative example does not include the stopper insulating layer 103.

Furthermore, the semiconductor pillars 120 include regions 122' instead of the regions 122. Each region 122', from the lower end to the upper end, has a generally cylindrical shape.

In addition, the comparative semiconductor memory device includes via contact electrodes Ch' instead of the via contact electrodes Ch. The diameter (in an XY cross-section) of the lower end of each via contact electrode Ch' is smaller than the diameter of the upper end of the semiconductor pillar 120. The center positions of all the via contact electrodes Ch' in the Y direction coincide with the center positions of the semiconductor pillars 120 in the Y direction.

In the manufacturing of the comparative semiconductor memory device, the process steps described above with reference to FIGS. 13 through 15 are not performed.

Advantageous Effects of the First Embodiment

In the comparative semiconductor memory device, a plurality of via contact electrodes connected to components (for example, an inter-finger electrode 141) other than the semiconductor pillars 120 are formed at a height position corresponding to the via contact electrodes Ch'. These via contact electrodes are formed simultaneously with (in the same processes as) the via contact electrodes Ch'. However, the height position of the upper ends of the semiconductor pillars 120 differ from those of the other components. In order to form these other via contact electrodes connected to the other components (that is, not semiconductor pillars 120) in the manufacturing of the comparative semiconductor memory device, RIE using the stopper insulating layer 105 as a stopper is performed in a process step corresponding to FIG. 25, and then additional RIE processing is performed under conditions appropriate for reaching the height positions of the upper ends of the respective other components.

In the manufacturing of the comparative semiconductor memory device, the thickness of the insulating layer 104 produced in a process step corresponding to FIG. 21 may vary somewhat in different portions of the device (or die-to-die). Therefore, when the contact holes ChA are formed in a process step corresponding to FIG. 25, there is fear that semiconductor pillars 120 might not be exposed at the bottoms of contact holes ChA in an area where the insulating layer 104 is too thick, and therefore the semiconductor pillars 120 cannot be connected to bit lines BL by the too shallowly etched contact holes ChA. If the insulating layer 104 is too thin when the contact holes ChA are being formed in a process step corresponding to FIG. 25, there is fear that one or more conductive layers 110 may be exposed due to a displacement (misalignment) of contact holes ChA in an area where the insulating layer 104 is thin, which may cause a short-circuit between a conductive layer 110 and a bit line BL.

In view of the above concerns, in the manufacturing of the semiconductor memory device according to the first embodiment, a part of the peripheral surface of each semiconductor pillar 120 is exposed in the process step described above with reference to FIG. 13, and the insulating layer 103A is formed on the exposed part of each semiconductor pillar 120 in the process step described above with reference to FIG. 14. Further, in the process step described above with reference to FIG. 15, a portion of the insulating layer 103A formed in the area between the semiconductor pillars 120 is allowed to remain as the stopper insulating layer 103 and the upper ends of the semiconductor pillars 120 can be exposed. Thus, in the process step described above with reference to FIG. 25, RIE for forming contact holes ChA can be performed using the stopper insulating layer 103 as a stopper to avoid over etching of the contact holes ChA to reach a conductive layer 110.

According to such a method, the upper surface of the stopper insulating layer 103 is to be located at level lower than the upper ends of the semiconductor pillars 120. Therefore, in the process step described above with reference to FIG. 25, if displacement (misalignment) of a contact hole ChA occurs, the upper end of the semiconductor pillar 120 can be exposed while preventing a conductive layer 110 from being exposed at the bottom of the contact hole ChA. Thus, the semiconductor pillars 120 can be well connected to the via contact electrodes Ch while avoiding a potential short-circuit between a conductive layer 110 and a bit line BL.

As described above, as with the sacrificial layers 110A, the stopper insulating layer 103 includes silicon nitride (SiN) or the like. Therefore, if the stopper insulating layer 103 becomes exposed in the trench STA in the process step described above with reference to FIG. 17, there is fear that the stopper insulating layer 103 may be removed in the removal of the sacrificial layers 110A.

In order not to expose such a stopper insulating layer in the trench STA, it is possible to remove part of the stopper insulating layer by a method such as photolithography and etching before the formation of the insulating layer 104. Such a method, however, necessitates the provision of a manufacturing margin (tolerance) to account for possible displacement (misalignment) between the stopper insulating layer and the trench STA that can occur in a photolithography process. This may hinder increased integration or miniaturization of the semiconductor memory device.

In view of the above, in the manufacturing of the semiconductor memory device according to the first embodiment, a part of the peripheral surface of each semiconductor pillar 120 is exposed in the process step described above with reference to FIG. 13, the insulating layer 103A is formed on the exposed part of the peripheral surface of each semiconductor pillar 120 in the process step described above with reference to FIG. 14, and a part of the insulating layer 103A is removed in the process step described above with reference to FIG. 15.

Such a method enables a self-alignment positioning of the semiconductor pillars 120 and the stopper insulating layer 103. There is, therefore, no need to provide for alignment margin (process tolerance) between the stopper insulating layer 103 and the trench STA.

As described above with reference to FIG. 4, in the semiconductor memory device according to the first embodiment, the Y-direction center positions of the via contact electrodes Ch for semiconductor pillar row SCa are offset in the negative Y direction from the Y-direction center position of the semiconductor pillar row SCa. The Y-direction center positions of the via contact electrodes Ch for semiconductor pillar row SCb are offset in the positive Y direction from the Y-direction center position of the semiconductor pillar row SCb.

According to such a construction, the via contact electrodes Ch located near a Y-direction end of the stopper insulating layer 103 are disposed at a longer distance from the Y-direction end of the stopper insulating layer 103. This can more effectively prevent a short-circuit between a conductive layer 110 and a bit line BL.

Second Embodiment

As described above with reference to FIG. 5, the semiconductor memory device according to the first embodiment includes the stopper insulating layer 105. However, in the first embodiment, the stopper insulating layer 103 is used as a stopper when the contact holes ChA are formed in the process step described above with reference to FIG. 25. It is, therefore, conceivable to omit the stopper insulating layer 105. Such an embodiment will now be described.

Figure 27:
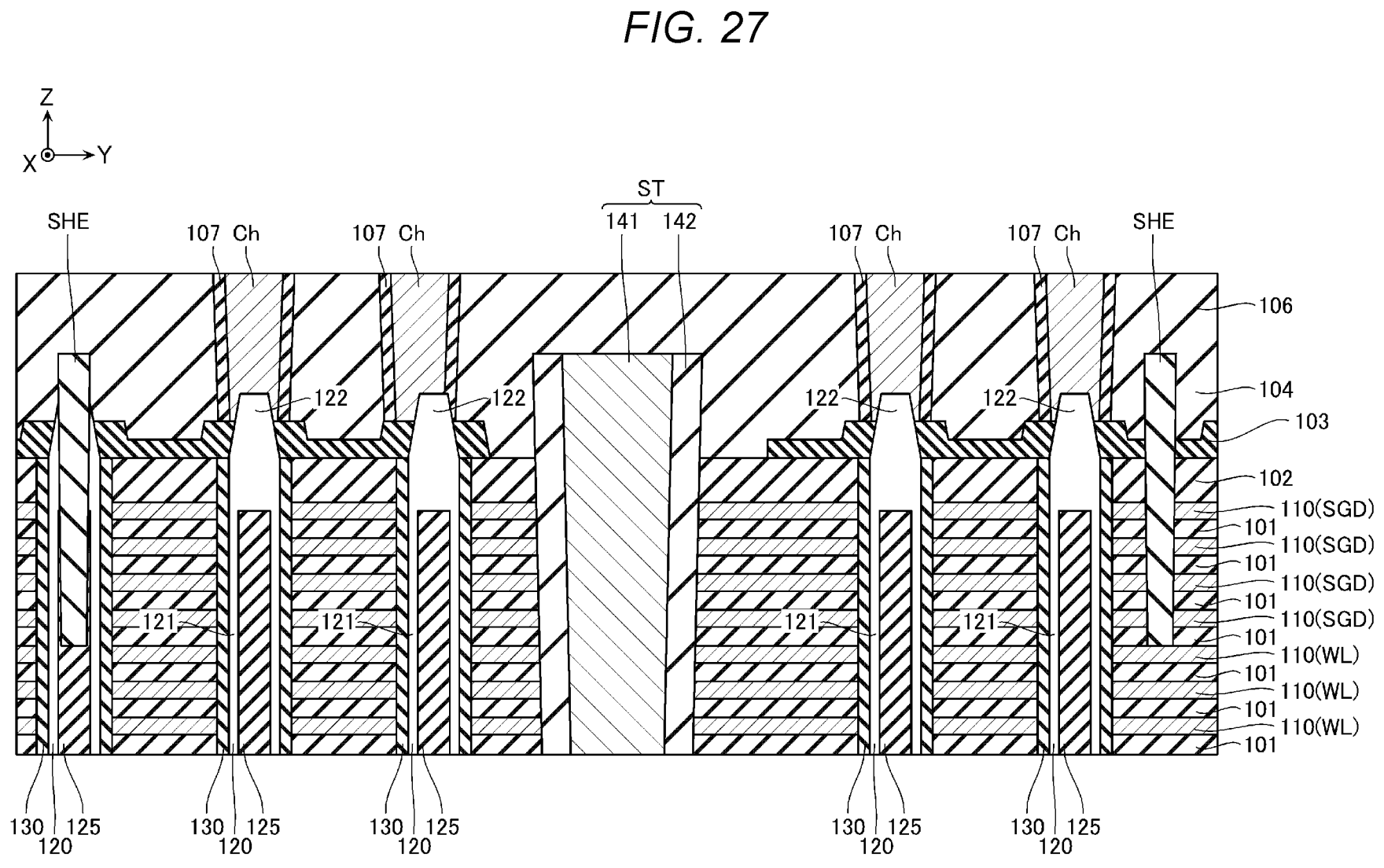

FIG. 27 is a schematic cross-sectional view of a portion of a semiconductor memory device according to a second embodiment. The semiconductor memory device according to the second embodiment basically has the same construction as the first embodiment, except that the semiconductor memory device according to the second embodiment does not have the stopper insulating layer 105. Thus, in the second embodiment, the insulating layer 106 is formed on the upper surface of the insulating layer 104.

The semiconductor memory device according to the second embodiment can achieve the same effect as the semiconductor memory device according to the first embodiment. Compared to the semiconductor memory device according to the first embodiment, the semiconductor memory device according to the second embodiment enables the omission of a manufacturing step.

Third Embodiment

The semiconductor memory device according to the first embodiment and the semiconductor memory device according to the second embodiment each include the stopper insulating layer 103. As shown in FIGS. 5 and 27, the upper surface of the stopper insulating layer 103 has raised portions and recessed portions (the upper surface of the insulating layer 103 is not flat/level). However, it is conceivable that the upper surface of the stopper insulating layer 103, formed in the process step described above with reference to FIG. 14 might not have any such raised portions and recessed portions as depicted in FIGS. 5 and 27 when the stopper insulating layer 103 has, for example, a sufficiently large thickness. Such an embodiment will now be described.

Figure 28:
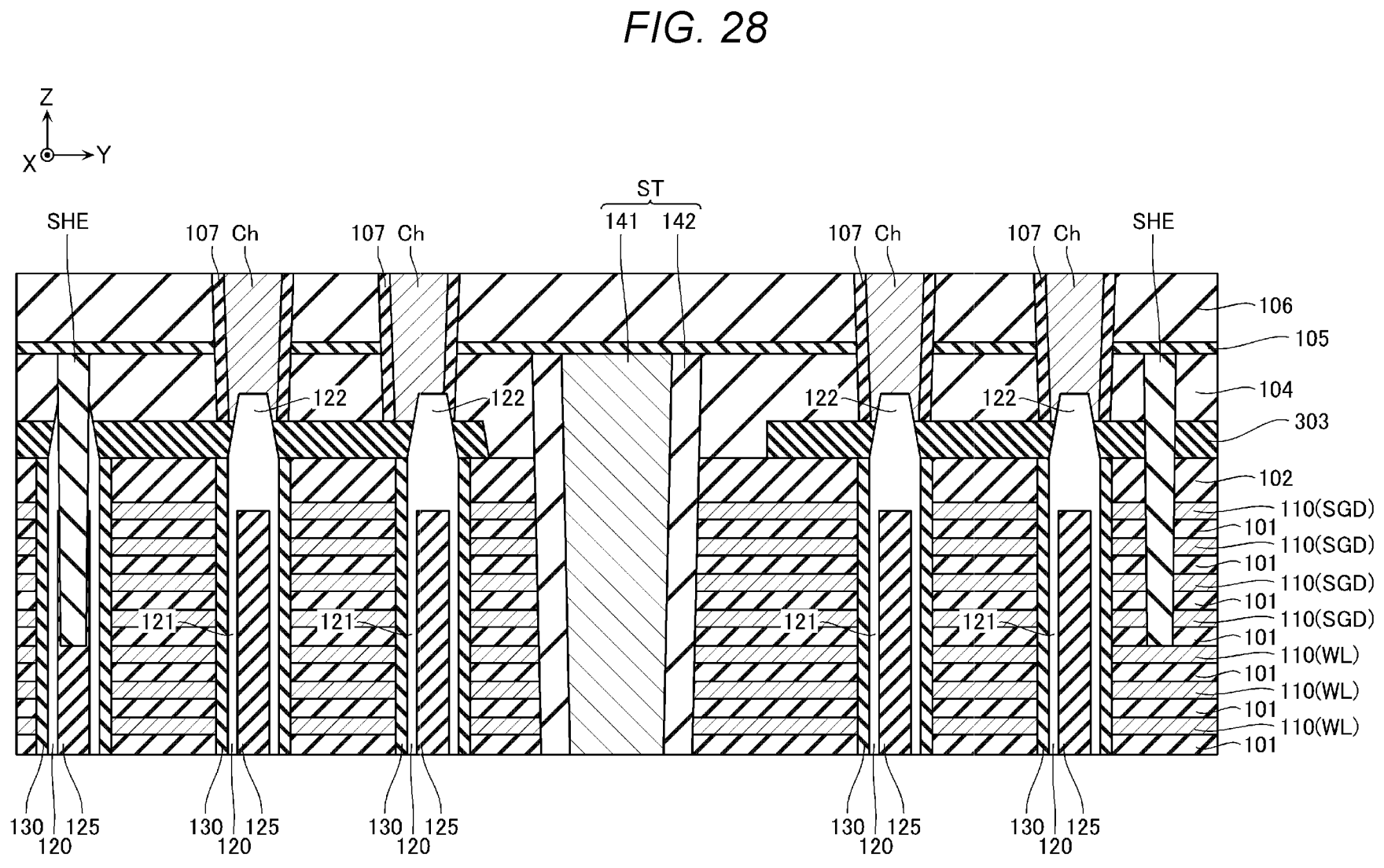

FIG. 28 is a schematic cross-sectional view of a portion of a semiconductor memory device according to a third embodiment. The semiconductor memory device according to the third embodiment basically has the same construction as the semiconductor memory device according to the first embodiment, except that the semiconductor memory device according to the third embodiment includes a stopper insulating layer 303 instead of the stopper insulating layer 103. The stopper insulating layer 303 has a similar construction as that of the stopper insulating layer 103 except that the stopper insulating layer 303 has a generally flat upper surface.

The semiconductor memory device according to the third embodiment can achieve the same effect as the semiconductor memory device according to the first embodiment.

As with the semiconductor memory device according to the second embodiment, the semiconductor memory device according to the third embodiment may not have the stopper insulating layer 105 in some examples.

Fourth Embodiment

In the semiconductor memory devices according to the first to third embodiments, the semiconductor pillars 120 each include a region 122. As shown in FIGS. 5, 27 and 28, the region 122 has a generally conical (tapering) shape in the portion ranging from the height position corresponding to the upper surface of the insulating layer 102 to the upper end. However, it is conceivable that the entire region 122 can be formed in a generally cylindrical (non-tapering) shape when the process step described above with reference to FIG. 13 is performed in such a manner that the semiconductor layer 122A is not partly removed. Such an example will now be described.

Figure 29:
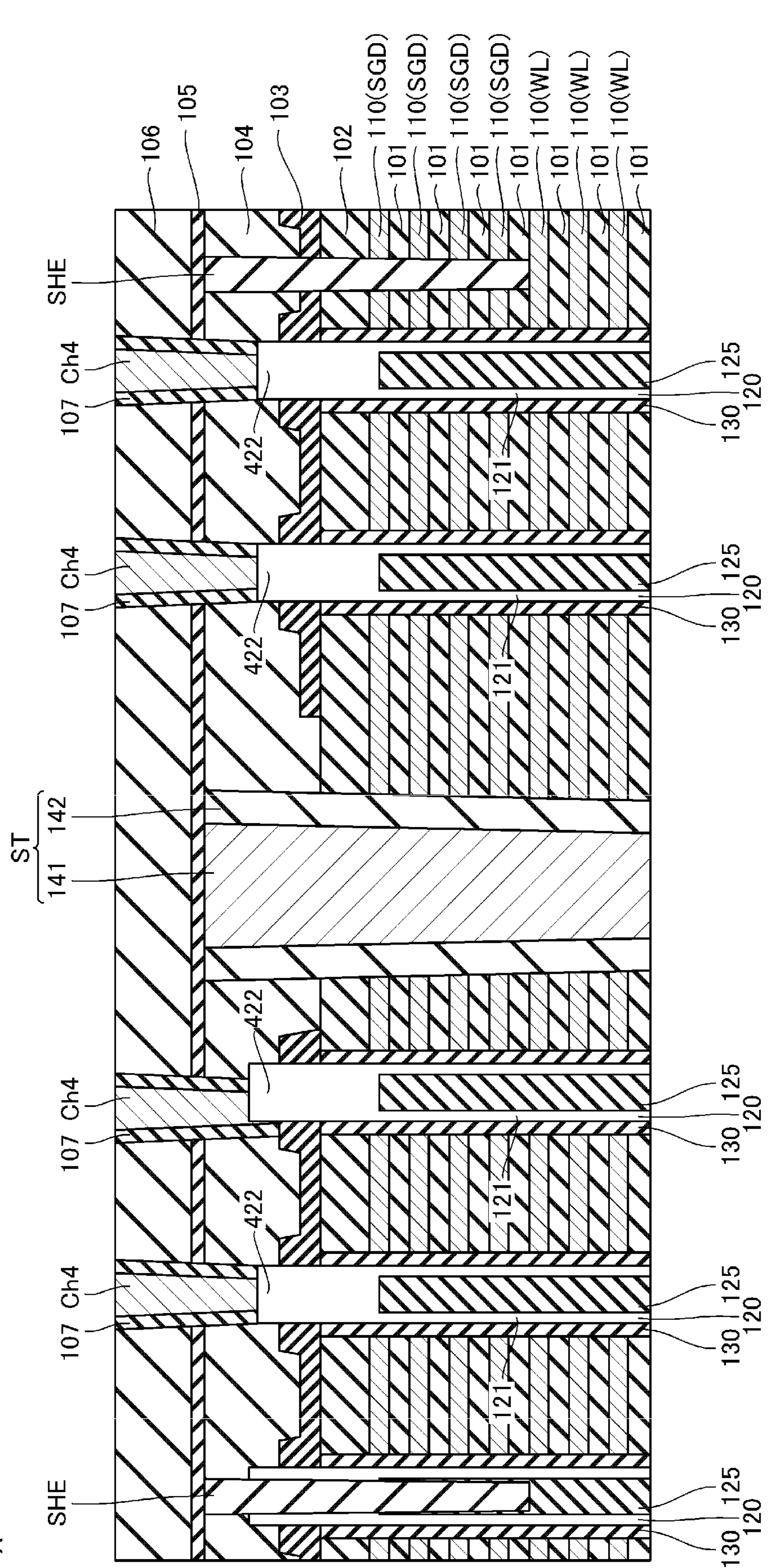
FIG. 29 is a schematic cross-sectional view of a portion of a semiconductor memory device according to a fourth embodiment.

FIG. 29 is a schematic cross-sectional view of a portion of a semiconductor memory device according to a fourth embodiment. The semiconductor memory device according to the fourth embodiment has the same basic construction as the semiconductor memory device according to the first embodiment. However, the semiconductor pillars 120 according to the fourth embodiment each include a region 422 instead of a region 122. The region 422 is similar to the region 122 except that the region 422 has a generally cylindrical shape rather than conical.

The semiconductor memory device according to the fourth embodiment also includes via contact electrodes Ch4 instead of the via contact electrodes Ch. The via contact electrodes Ch4 have a similar construction as the via contact electrodes Ch except that the diameter (in an XY cross-section) of the lower end of each via contact electrode Ch4 may be smaller than the diameter of the upper end of the semiconductor pillar 120.

The semiconductor memory device according to the fourth embodiment can achieve the same effect as the semiconductor memory device according to the first embodiment.

As with the semiconductor memory device according to the second embodiment, the semiconductor memory device according to the fourth embodiment need not have the stopper insulating layer 105 in some examples.

As with the semiconductor memory device according to the third embodiment, the semiconductor memory device according to the fourth embodiment may include the stopper insulating layer 303 instead of the stopper insulating layer 103 in some examples.

Fifth Embodiment

Figure 30:
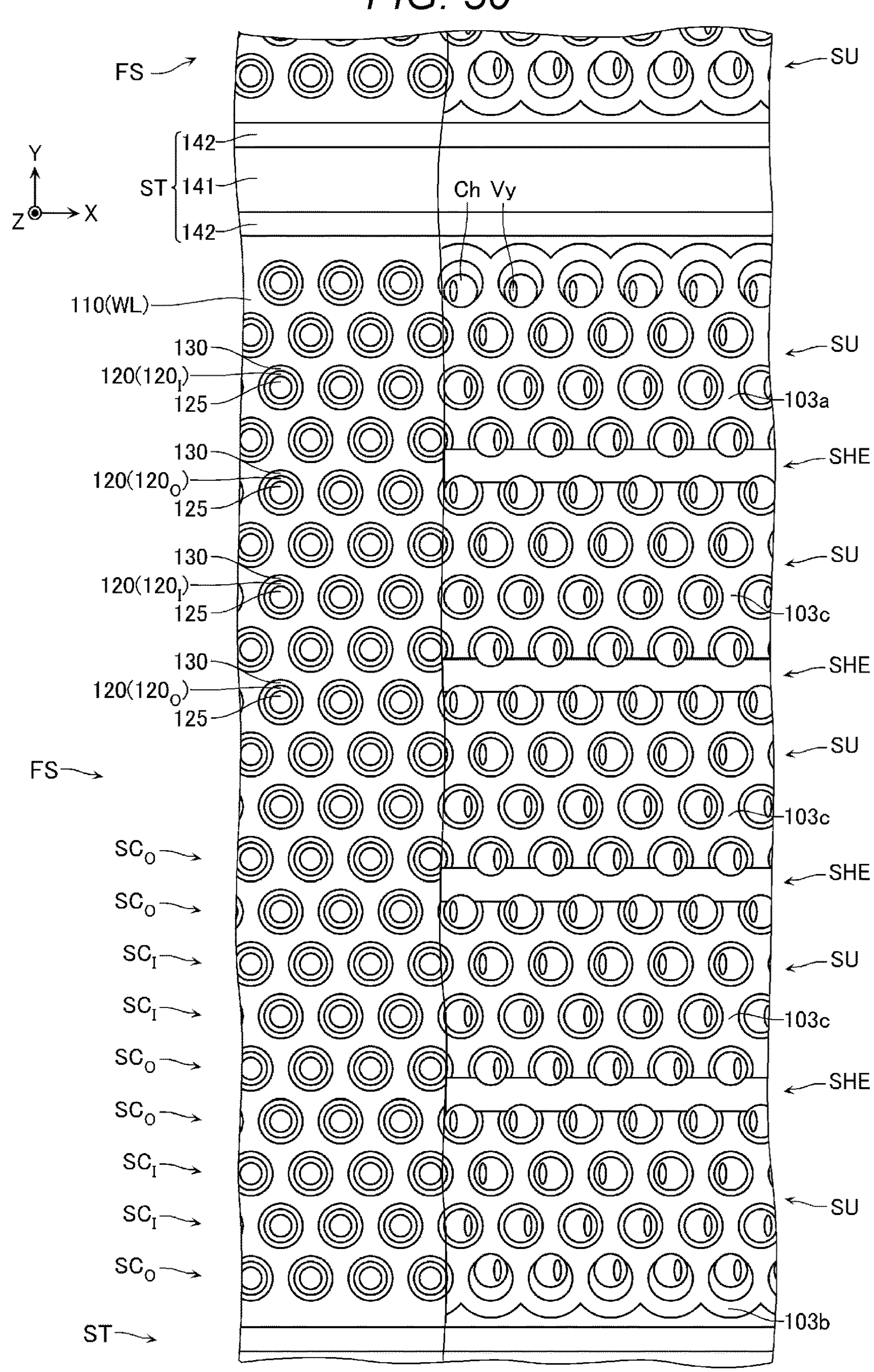
FIG. 30 is a schematic plan view of a portion of a semiconductor memory device according to a fifth embodiment.
Figure 31:
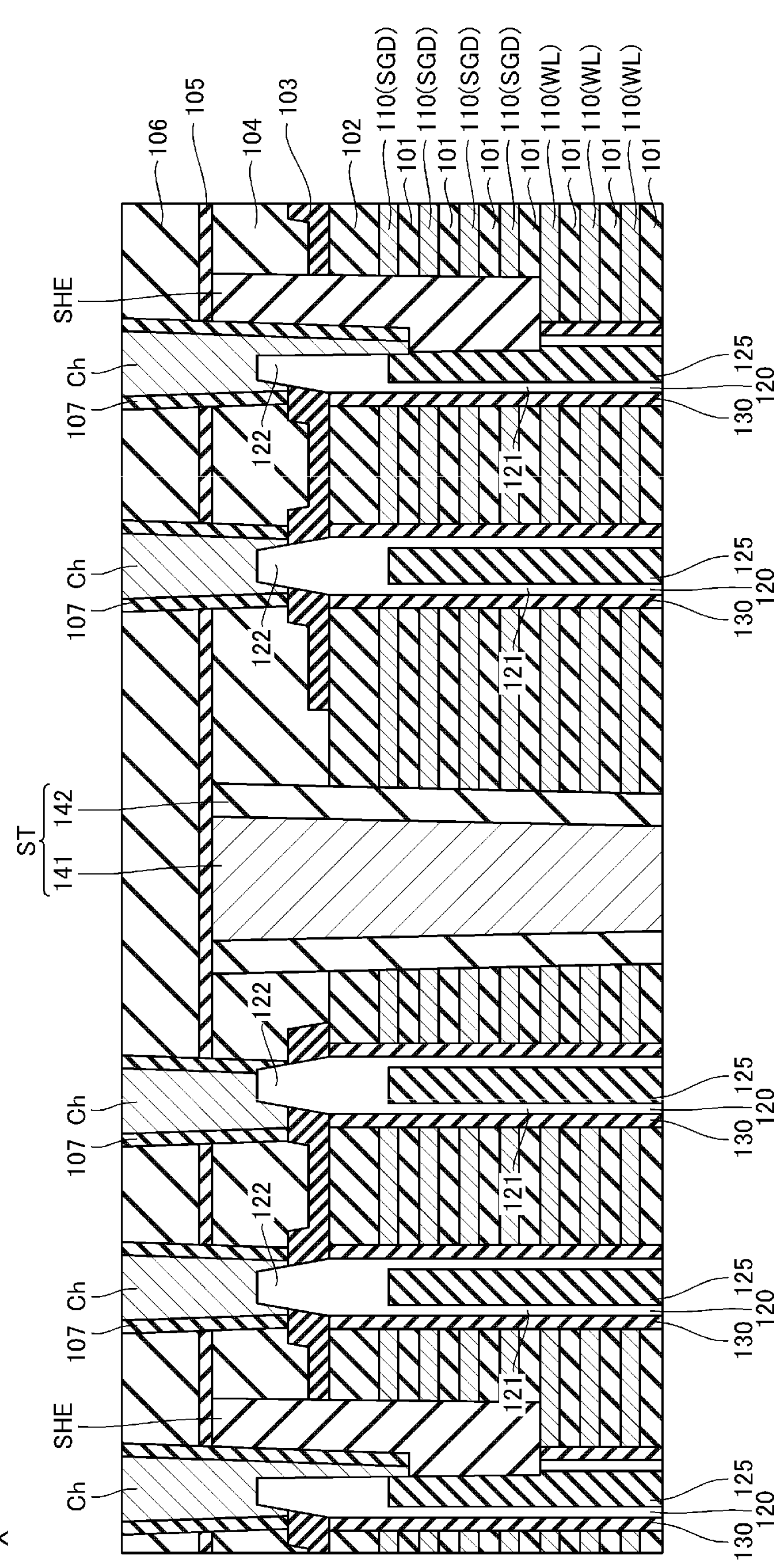
FIG. 31 is a schematic cross-sectional view of a portion of a semiconductor memory device according to a fifth embodiment.

FIG. 30 is a schematic plan view of a portion of a semiconductor memory device according to a fifth embodiment. FIG. 31 is a schematic cross-sectional view of a portion of the semiconductor memory device according to the fifth embodiment.

The semiconductor memory device according to the fifth embodiment has a construction similar to the semiconductor memory device according to the first embodiment. However, each finger structure FS according to the fifth embodiment includes 20 semiconductor pillar rows SC provided in an area ranging from one end to the opposite end in the Y direction. In the fifth embodiment, the semiconductor pillars 120 of each of the 20 semiconductor pillar rows SC are electrically connected to bit lines BL by via contact electrodes Ch, Vy, and function as part of memory cells.

In the fifth embodiment, the inter-string unit insulating members SHE are provided between the 4th and 5th semiconductor pillar rows SC, between the 8th and 9th semiconductor pillar rows SC, between the 12th and 13th semiconductor pillar rows SC, and between the 16th and 17th semiconductor pillar rows SC, as such rows are counted from the negative side in the Y direction.

The (4n+1)th (where n is an integer of 0 to 4) and (4n+4)th semiconductor pillar rows SC of each finger structure FS are referred to as semiconductor pillar rows SCO. The semiconductor pillars 120 of the semiconductor pillar rows SCO are referred to as semiconductor pillars 120O. The (4n+2)th and (4n+3)th semiconductor pillar rows SC of each finger structure FS are referred to as semiconductor pillar rows SCI. The semiconductor pillars 120 of the semiconductor pillar rows SCI are referred to as semiconductor pillars 120I.

The semiconductor pillars 120I have the same construction as the semiconductor pillars 120 according to the first embodiment. The semiconductor pillars 120O of the first semiconductor pillar row SCO as counted from the negative side in the Y direction and as counted from the positive side in the Y direction also have the same construction as the semiconductor pillars 120 according to the first embodiment.

The other semiconductor pillars 120O have construction similar to the semiconductor pillars 120 according to the first embodiment. However, these other semiconductor pillars 120O are each partly cut by a trench SHEA in a manufacturing process step corresponding to FIG. 22. Accordingly, as shown in FIG. 31, such a semiconductor pillar 120O and the corresponding gate insulating film 130 and insulator pillar 125 are in a partially-cut shape in a region corresponding to an inter-string unit insulating member SHE and are in contact with the inter-string unit insulating member SHE.

In the example of FIG. 31, the via contact electrode Ch connected to such a partial or cut semiconductor pillar 120O and the corresponding insulating layer 107 extend in the Z-direction while penetrating part of the inter-string unit insulating member SHE.

The semiconductor memory device according to the fifth embodiment can achieve the same effect as the semiconductor memory device according to the first embodiment.

As with the semiconductor memory device according to the second embodiment, the semiconductor memory device according to the fifth embodiment need not have the stopper insulating layer 105 in some examples.

As with the semiconductor memory device according to the third embodiment, the semiconductor memory device according to the fifth embodiment may include the stopper insulating layer 303 instead of the stopper insulating layer 103 in some examples.

As with the semiconductor pillars 120 according to the fourth embodiment, the semiconductor pillars 120 according to the fifth embodiment may each include the region 422 instead of the region 122 in some examples.

Sixth Embodiment

Figure 32:
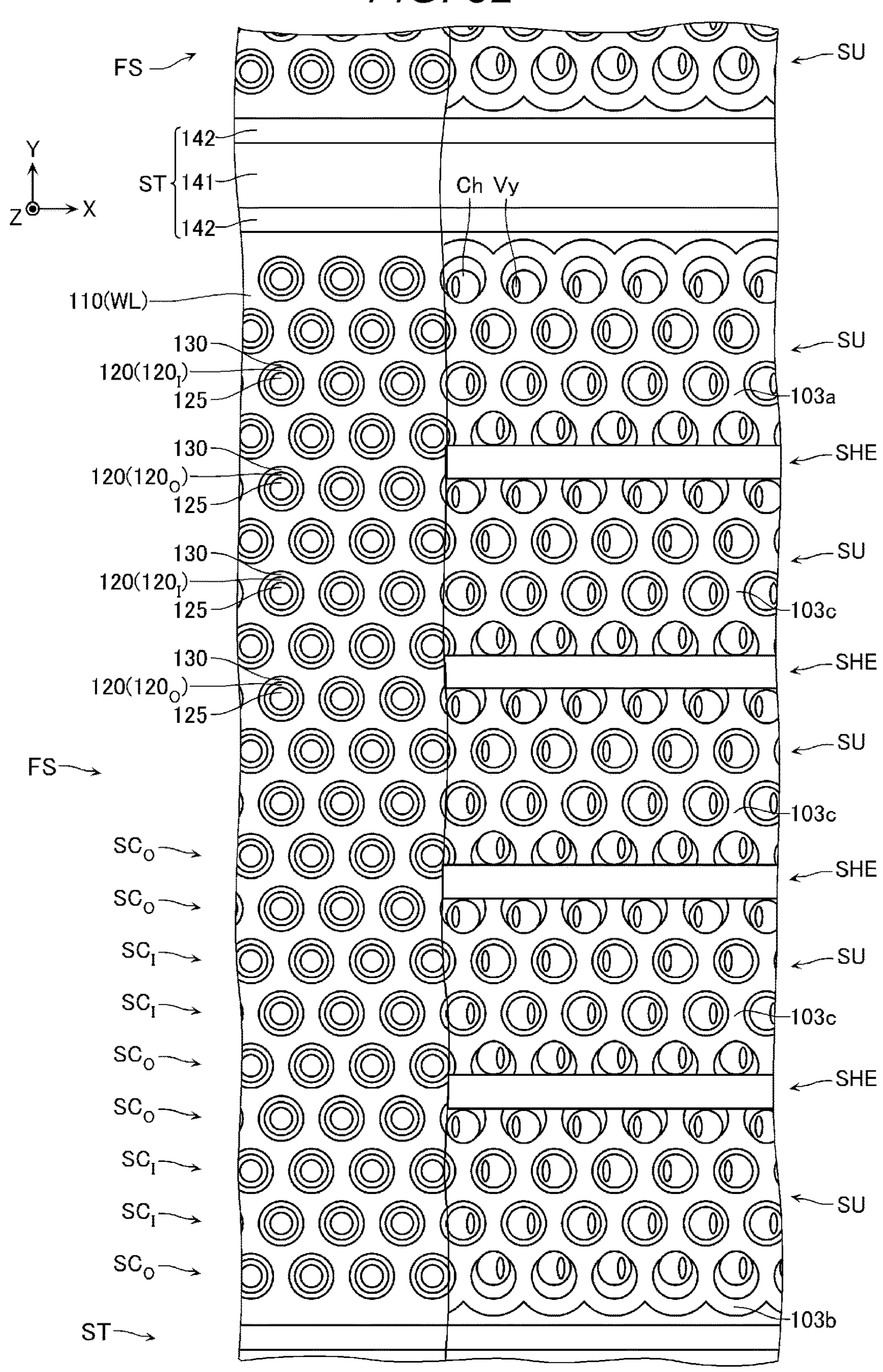
FIG. 32 is a schematic plan view of a portion of a semiconductor memory device according to a sixth embodiment.
Figure 33:
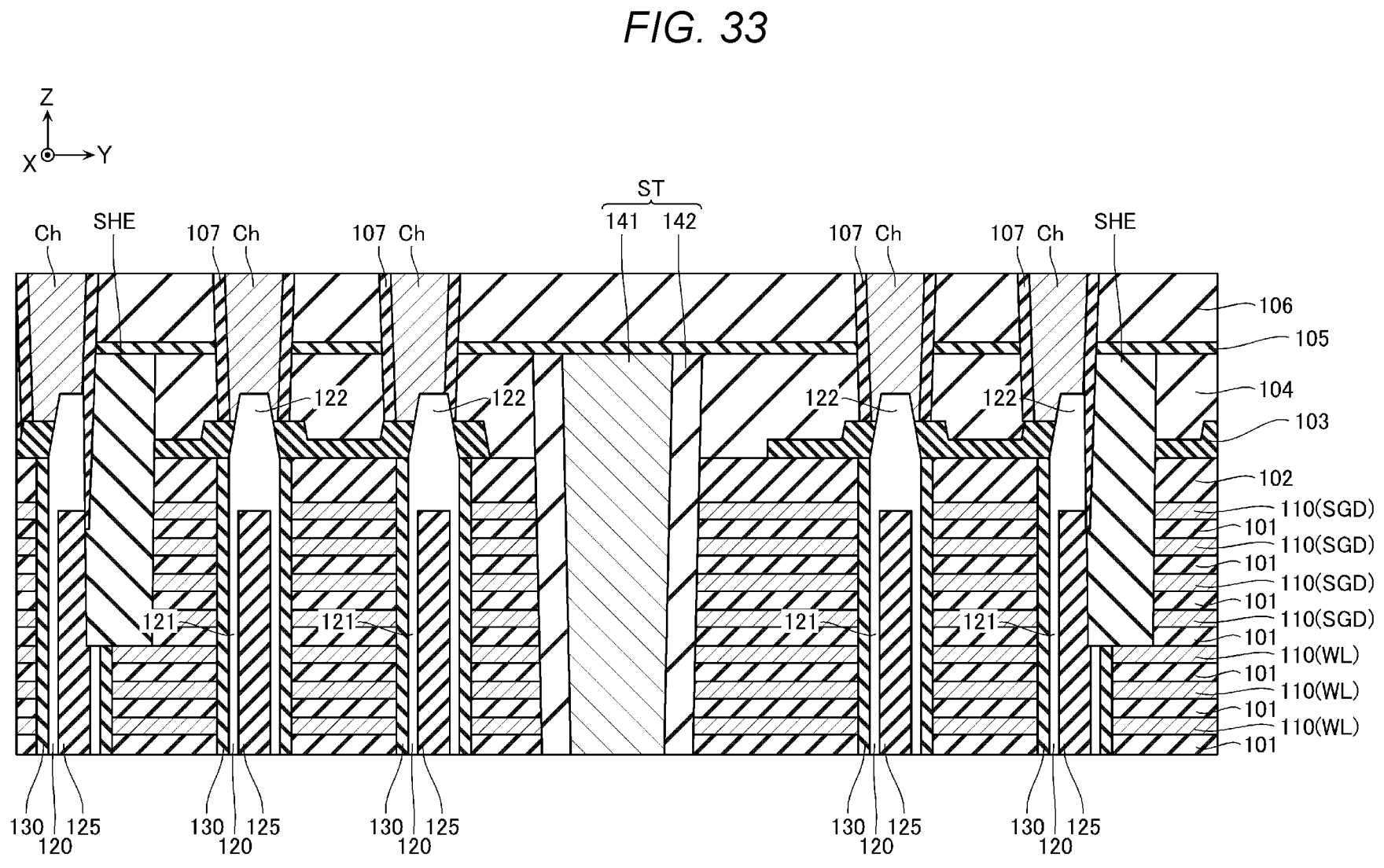

FIG. 32 is a schematic plan view of a portion of a semiconductor memory device according to a sixth embodiment. FIG. 33 is a schematic cross-sectional view of a portion of the semiconductor memory device according to the sixth embodiment.

The semiconductor memory device according to the sixth embodiment has a construction similar to the semiconductor memory device according to the fifth embodiment. However, as shown in FIG. 30 for the fifth embodiment, over the 2nd to 19th semiconductor pillar rows SC (as counted from the negative side in the Y direction), the Y-direction center position of each semiconductor pillar 120 coincides with the Y-direction center position of the corresponding via contact electrode Ch.

As shown in FIG. 32 for the sixth embodiment, the Y-direction center position of the via contact electrodes Ch corresponding to the (4n+4)th semiconductor pillar row SCO as counted from the negative side in the Y direction, is to the more negative side in the Y direction than the Y-direction center position of the semiconductor pillar row SCO. Further, the Y-direction center position of the via contact electrodes Ch corresponding to the (4n+1)th semiconductor pillar row SCO (as counted from the negative side in the Y direction) is to the more positive side in the Y direction than the Y-direction center position of the semiconductor pillar row SCO.

The semiconductor memory device according to the sixth embodiment can achieve the same effect as the semiconductor memory device according to the fifth embodiment.

As shown in FIG. 33 for the semiconductor memory device of the sixth embodiment, via contact electrodes Ch, located near an inter-string unit insulating member SHE, can be disposed at a greater distance from the inter-string unit insulating member SHE. This can more effectively prevent a short-circuit between a conductive layer 110 and a bit line BL.

As with the semiconductor memory device according to the second embodiment, the semiconductor memory device according to the sixth embodiment need not have the stopper insulating layer 105 in some examples.

As with the semiconductor memory device according to the third embodiment, the semiconductor memory device according to the sixth embodiment may include the stopper insulating layer 303 instead of the stopper insulating layer 103 in some examples.

As with the semiconductor pillars 120 according to the fourth embodiment, the semiconductor pillars 120 according to the sixth embodiment may each include the region 422 instead of the region 122.

Other Embodiments

As described above with reference to FIG. 4 for the first embodiment, the Y-direction center position of the via contact electrodes Ch corresponding to each of the two semiconductor pillar rows SCa, SCb adjacent to each other across the inter-finger structure ST are offset to opposite sides of the Y-direction center position for the semiconductor pillar row SCa or SCb.

The position of the via contact electrodes Ch need not coincide with a design value. In such a case, the difference between the Y-direction center position of the semiconductor pillar row SCa or SCb and the Y-direction center position of the corresponding via contact electrodes Ch may be larger than the difference between the Y-direction center position of each semiconductor pillar row SCc and the Y-direction center position of the corresponding via contact electrodes Ch.

As described above with reference to FIG. 32 for the sixth embodiment, the Y-direction center position of the via contact electrodes Ch corresponding to each of the two semiconductor pillar rows SCO adjacent to each other across an inter-string unit insulating member SHE is provided on the opposite side of the Y-direction center position of the semiconductor pillar row SCO.

Also in such a structure, the position of the via contact electrodes Ch need not coincide with a design value. In such a case, the difference between the Y-direction center position of a semiconductor pillar row SCO and the Y-direction center position of the corresponding via contact electrodes Ch may be larger than the difference between the Y-direction center position of each semiconductor pillar row SCI and the Y-direction center position of the corresponding via contact electrodes Ch.

In the first to sixth embodiments, the Y-direction center positions of all the via contact electrodes Ch may coincide with the Y-direction center positions of the corresponding semiconductor pillars 120.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
- a plurality of conductive layers stacked in a first direction;
- a first insulating layer on a first side of the plurality of conductive layers;
- a second insulating layer on the first insulating layer, the first insulating layer being between the second insulating layer and the plurality of conductive layers in the first direction;
- a first semiconductor pillar extending in the first direction through the plurality of conductive layers and the first insulating layer, a first end of the first semiconductor pillar extends in the first direction to a position beyond the first insulating layer and the plurality of conductive layers;
- a first charge storage film between the first semiconductor pillar and the plurality of conductive layers;
- a via contact electrode extending in the first direction through the second insulating layer and contacting the first end of the first semiconductor pillar; and
- an inter-finger insulating structure extending in the first direction through the plurality of conductive layers, the inter-finger insulating structure extending lengthwise in a second direction intersecting the first direction and being spaced from the first semiconductor pillar in a third direction intersecting the first and second directions, wherein
- the first insulating layer comprises a material different from that of the second insulating layer, and
- the first insulating layer is separated from the inter-finger insulating structure in the third direction.

2. The semiconductor memory device according to claim 1, wherein the first insulating layer comprises nitrogen (N) and silicon (Si).

3. The semiconductor memory device according to claim 1, wherein one end of the via contact electrode in the first direction contacts the first insulating layer.

4. The semiconductor memory device according to claim 1, wherein the first insulating layer directly contacts a portion of the first semiconductor pillar.

5. The semiconductor memory device according to claim 1, wherein the first semiconductor pillar has a first region facing the plurality of conductive layers and a second region between the first region and the via contact electrode in the first direction, the second region contains an impurity, the second region is connected to the via contact electrode, and the second region has a peripheral surface surrounded by the first insulating layer.

6. The semiconductor memory device according to claim 5, wherein the first insulating layer directly contacts the second region of the first semiconductor pillar.

7. The semiconductor memory device according to claim 5, further comprising:

an insulator pillar extending in the first direction and having a peripheral surface surrounded by the first region of the first semiconductor pillar, wherein an end of the insulator pillar nearest the via contact electrode in the first direction is separated from the first end of the first semiconductor pillar in the first direction.

8. The semiconductor memory device according to claim 1, wherein the first semiconductor pillar tapers inwardly in a portion proximate to the first end.

9. The semiconductor memory device according to claim 1, wherein the dimension of the via contact electrode along a direction perpendicular to the first direction at a position where the via contact electrode contacts the first end of the first semiconductor pillar is greater than the dimension of the first end in the direction perpendicular to the first direction at the position.

10. The semiconductor memory device according to claim 1, wherein the first insulating layer does not overlap all portions of the plurality of conductive layers in the first direction.

11. The semiconductor memory device according to claim 1, further comprising:

a second semiconductor pillar extending in the first direction through the plurality of conductive layers and the first insulating layer, the second semiconductor pillar being spaced from the first semiconductor pillar in the second direction; and a second charge storage film between the second semiconductor pillar and the plurality of conductive layers, wherein the first insulating layer includes a first region within a first distance from the first semiconductor pillar in the second direction, a second region within the first distance from the second semiconductor pillar in the second direction, and a third region between the first region and the second region in the second direction, and the thickness of the third region in the first direction is less than the thicknesses of the first and second regions in the first direction.

12. A semiconductor memory device, comprising:

a first finger structure and a second finger structure arranged along a first direction; and an inter-finger insulating structure between the first and second finger structures in the first direction, wherein the first finger structure and the second finger structure each comprise:

a plurality of first conductive layers stacked in a stacking direction intersecting the first direction;

a first insulating layer on a first side of the plurality of first conductive layers in the stacking direction; and a plurality of semiconductor pillar rows arranged along the first direction, and each semiconductor pillar row comprising a plurality of semiconductor pillars arranged along a second direction intersecting the first direction and the stacking direction, each semiconductor pillar extending in the stacking direction through the first insulating layer and the plurality of first conductive layers, a second finger structure-side surface of the first insulating layer in the first finger structure has a plurality of first portions at positions corresponding to the center positions, in the second direction, of the semiconductor pillars of a first semiconductor pillar row nearest to the second finger structure among the plurality of semiconductor pillar rows in the first finger structure, the second finger structure-side surface of the first insulating layer in the first finger structure has a plurality of second portions arranged alternately with the first portions in the second direction, the positions of the first portions in the first direction are closer to the second finger structure than are the positions of the second portions in the first direction, and the first insulating layer of each of the first and second finger structures is separated from the inter-finger insulating structure in the first direction such that a gap is left between respective outer edges of the first insulating layers and the inter-finger insulating structure.

13. The semiconductor memory device according to claim 12, wherein the first insulating layer comprises nitrogen and silicon.

14. The semiconductor memory device according to claim 12, wherein the first conductive layers in each of the first finger structure and the second finger structure have a portion that is not overlapped by the first insulating layer, and the portions face each other in the first direction across the inter-finger insulating structure.

15. The semiconductor memory device according to claim 12, wherein the first finger structure includes a plurality of first via contact electrodes contacting ends of the semiconductor pillars of the first semiconductor pillar row, and the first-direction center position of the first via contact electrodes is farther from the second finger structure than the first-direction center position of the first semiconductor pillar row.

16. The semiconductor memory device according to claim 15, wherein the first finger structure further comprises:

a plurality of second via contact electrodes contacting ends of the semiconductor pillars of a second semiconductor pillar row adjacent to the first semiconductor pillar row in the first direction, and the distance between the first-direction center position of the first via contact electrodes and the first-direction center position of the first semiconductor pillar row is greater than the distance between the first-direction center position of the second via contact electrodes and the first-direction center position of the second semiconductor pillar row.

17. The semiconductor memory device according to claim 12, wherein the first finger structure further comprises:

a second conductive layer and a third conductive layer, between the plurality of first conductive layers and the first insulating layer, and the second and third conductive layers being adjacent to each other in the first direction;

an insulating member between the second conductive layer and the third conductive layer;

a third semiconductor pillar row and a fourth semiconductor pillar row of the plurality of semiconductor pillar rows, the third and fourth semiconductor pillar rows being adjacent to each other across the insulating member in the first direction; and a plurality of third via contact electrodes contacting ends of the semiconductor pillars of the third semiconductor pillar row, and the first-direction center position of the third via contact electrodes is farther from the insulating member than the first-direction center position of the third semiconductor pillar row.

18. The semiconductor memory device according to claim 17, wherein the first finger structure further comprises:

a plurality of fourth via contact electrodes contacting ends of the semiconductor pillars of a fifth semiconductor pillar row among the plurality of semiconductor pillar rows in the first finger structure, the fifth semiconductor pillar row being adjacent to the third semiconductor pillar row in the first direction, the third semiconductor pillar row being between the fifth and fourth semiconductor pillar rows in the first direction, and the distance between the first-direction center position of the third via contact electrodes and the first-direction center position of the third semiconductor pillar row is greater than the distance between the first-direction center position of the fourth via contact electrodes and the first-direction center position of the fifth semiconductor pillar row.

19. The semiconductor memory device according to claim 17, wherein the semiconductor pillars of the third and fourth semiconductor pillar rows each have a partially-cut shape at a position corresponding to a position of the insulating member in the stacking direction.

20. The semiconductor memory device according to claim 12, wherein the first finger structure and the second finger structure each comprise:

a second insulating layer on the opposite side of the first insulating layer from the plurality of first conductive layers in the stacking direction; and a via contact electrode on the opposite side of the first insulating layer from the plurality of first conductive layers in the stacking direction, extending in the stacking direction, having a peripheral surface surrounded by the second insulating layer, and connected to a first end of a first semiconductor pillar of the plurality of semiconductor pillars, the first insulating layer comprises a material different from that of the second insulating layer, and the surface of the first insulating layer on the side of the second insulating layer in the stacking direction is nearer to the plurality of first conductive layers than is the first end of the first semiconductor pillar.

* * * * *